(12) United States Patent
Kanamori et al.

(10) Patent No.: US 7,370,168 B2
(45) Date of Patent: May 6, 2008

(54) MEMORY CARD CONFORMING TO A MULTIPLE OPERATION STANDARDS

(75) Inventors: Motoki Kanamori, Tachikawa (JP); Kunihiro Katayama, Chigasaki (JP); Yasuhiro Nakamura, Tachikawa (JP); Satoshi Yoshida, Tachikawa (JP); Shinsuke Asari, Akishima (JP)

(73) Assignee: Renesas Technology Corp., Tokyo (JP)

( * ) Notice: Subject to any disclaimer, the term of this patent is extended or adjusted under 35 U.S.C. 154(b) by 278 days.

(21) Appl. No.: 10/811,898

(22) Filed: Mar. 30, 2004

(65) Prior Publication Data
US 2004/0215996 A1   Oct. 28, 2004

(30) Foreign Application Priority Data
Apr. 25, 2003   (JP) .............................. 2003-121388

(51) Int. Cl.
*G06F 12/00* (2006.01)
(52) U.S. Cl. ......................... 711/167; 713/600; 365/233
(58) Field of Classification Search ..................... None
See application file for complete search history.

(56) References Cited

U.S. PATENT DOCUMENTS

| 6,407,940 B1* | 6/2002 | Aizawa ........................ 365/52 |
| 2002/0145935 A1* | 10/2002 | Yagishita .................... 365/233 |
| 2003/0151070 A1* | 8/2003 | Natori ......................... 257/200 |

* cited by examiner

*Primary Examiner*—Donald Sparks
*Assistant Examiner*—Thanh D. Vo
(74) *Attorney, Agent, or Firm*—Miles & Stockbridge P.C.

(57) ABSTRACT

The invention intends to provide a memory card conforming to an HS-MMC mode in a standard of a multimedia card, while securing compatibility of both standards of the multimedia card and an SD card. In a normal MMC mode, the data is outputted at a fall edge of a clock signal. A frequency of the clock signal is about 20 MHz. When the data is outputted at the fall edge of the clock signal, data output is in time for a next clock signal. When a parameter '1' is set to a timing register provided in a host interface, the memory card is transitioned into the HS-MMC mode. In the HS-MMC mode, a clock signal frequency is increased to about 52 MHz. Here, the data is outputted at the rise edge of the clock signal, whereby the data output is brought in time for the rise edge of the next clock signal.

8 Claims, 24 Drawing Sheets

FIG. 2

| PIN NO. | NAME OF PIN | I/O | CONTENTS |
|---|---|---|---|
| 1 | DAT3 | I/O | DATA BUS BIT [3] |
| 2 | CMD | I/O | COMMAND |
| 3 | VSS1 | - | GROUND |
| 4 | VCC | - | POWER SUPPLY |
| 5 | CLK | I | CLOCK |
| 6 | VSS2 | - | GROUND |
| 7 | DAT0 | I/O | DATA BUS BIT [0] |
| 8 | DAT1 | I/O | DATA BUS BIT [1] |
| 9 | DAT2 | I/O | DATA BUS BIT [2] |
| 10 | DAT4 | I/O | DATA BUS BIT [4] |
| 11 | DAT5 | I/O | DATA BUS BIT [5] |
| 12 | DAT6 | I/O | DATA BUS BIT [6] |
| 13 | DAT7 | I/O | DATA BUS BIT [7] |

FIG. 13

| TIMING REGISTER | POWER CONSUMPTION | FIRST AUXILIARY BUFFER | SECOND AUXILIARY BUFFER | THIRD AUXILIARY BUFFER |
|---|---|---|---|---|
| 0 | DON'T CARE | OFF | OFF | OFF |
| 1 | 1 | ON | OFF | OFF |
| | 2 | ON | ON | OFF |
| | 3 | ON | ON | ON |

FIG. 14

| POWER CONSUMPTION PARAMETER REGISTER | SOURCE OSCILLATION FREQUENCY | SYSTEM CLOCK |
|---|---|---|
| 0 (MAX 100mA) | 20MHz | 5MHz |
| 1 (MAX 150mA) | 20MHz | 6.6MHz |
| 2 (MAX 200mA) | 20MHz | 10MHz |
| 3 (MAX 250mA) | 20MHz | 20MHz |

| POWER CONSUMPTION PARAMETER REGISTER | PARALLEL OPERATIONAL NUMBER OF FLASH MEMORY |
|---|---|
| 0 (MAX 100mA) | 1 |
| 1 (MAX 150mA) | 2 |
| 2 (MAX 200mA) | 3 |
| 3 (MAX 250mA) | 4 |

FIG. 20

| POWER CONSUMPTION PARAMETER REGISTER | TIMING REGISTER = 0 | | | | TIMING REGISTER = 1 | | | |
|---|---|---|---|---|---|---|---|---|
| | BUS WIDTH × 1 | BUS WIDTH × 4 | BUS WIDTH × 8 | BUS WIDTH × 1 | BUS WIDTH × 1 | BUS WIDTH × 4 | BUS WIDTH × 8 |
| 0 (MAX 100mA) | NON-ACTIVATED | NON-ACTIVATED | NON-ACTIVATED | NON-ACTIVATED | NON-ACTIVATED | NON-ACTIVATED | NON-ACTIVATED |
| 1 (MAX 150mA) | NON-ACTIVATED | NON-ACTIVATED | ACTIVATED | NON-ACTIVATED | NON-ACTIVATED | NON-ACTIVATED | ACTIVATED |
| 2 (MAX 200mA) | NON-ACTIVATED | ACTIVATED | ACTIVATED | NON-ACTIVATED | ACTIVATED | ACTIVATED | ACTIVATED |
| 3 (MAX 250mA) | NON-ACTIVATED | ACTIVATED | ACTIVATED | ACTIVATED | ACTIVATED | ACTIVATED | ACTIVATED |

STANDARD FOR DATA OUTPUT TIMING IN MMC

STANDARD FOR DATA OUTPUT TIMING IN SD CARD tcyc: CYCLE TIME ≧ 19.2ns
tWL: CLOCK H OR L DURATION ≧ 6.5ns
tTHL: CLOCK FALL TIME ≧ 3ns
tTLH: CLOCK RIZE TIME ≧ 3ns
tOSU: DATA OUTPUT SETUP TIME ≧ 5ns
tOH: DATA OUTPUT HOLD TIME ≧ 5ns

MEMORY CARD CONFORMING TO A MULTIPLE OPERATION STANDARDS

CROSS-REFERENCE TO RELATED APPLICATION

The present application claims priority from Japanese patent application JP 2003-121388 filed on Apr. 25, 2003, the content of which is hereby incorporated by reference into this application.

BACKGROUND OF THE INVENTION

The present invention relates to a technique for improving the compatibility in the memory card, specifically to a technique effective in use for securing the compatibility in the card memory conforming to the HS-MMC (High Speed-Multimedia Card) mode.

The market has accepted the memory cards such as the multimedia card (registered trademark) standardized by the MMCA (Multimedia Card Association) being a standardization association, and the SD (Secure Digital) card (registered trademark) standardized by the SDA (SD card Association), as one of the external storage media for personal computers and multi-function terminals, etc. These memory cards are used for recording static images by a digital camera, recording communication data by a mobile telephone, and recording reproduced music by a portable music player, etc.

Many host computers including personal computers and multi-function terminals and so forth conform to both of the multimedia card and the SD card. Although the multimedia card and the SD card are different in the number of the external terminals (7 terminals in the multimedia card/9 terminals in the SD card), the multimedia card is thinner than the SD card, and the external terminal position thereof is compatible with that of the SD card. Therefore, the multimedia card can be used on the host computer that permits using the SD card.

In the normal mode of the multimedia card, as for the data output timing, the setup time/hold time of the data output is stipulated to the rise edge of the clock signal, as shown in FIG. 25 (refer to the standard specification by the MMCA for the details of the multimedia card).

On the other hand, in the case of the SD card, the timing of the data output is stipulated by the delay time from the fall edge of the clock signal, as shown in FIG., 26 (refer to the standard specification by the SDA for the details of the SD card).

In the case of using the multimedia card on the host computer conforming to the SD card, the data output timing is different; accordingly, the data differs from that of the SD card, and there arises an impossibility of the compatibility with each other.

Thus, some multimedia cards secure the compatibility with the host conforming to the SD card, by taking the timing being in time for the setup time and executing the data output at the fall edge of the clock signal.

SUMMARY OF THE INVENTION

The inventors discovered that the above memory cards involved the following problems.

Recently, the market has proposed the multimedia card operational in the HS-MMC mode as the next-generation standard. According to the standard of the HS-MMC mode, as shown in FIG. 27, the maximum frequency of the clock signal is 52 MHz (cycle time: 19.2 ns), the data output setup time is not shorter than 5 ns, and the hold time is not shorter than 5 ns (refer to the standard specification by the MMCA for the details of the HS multimedia card).

In the multimedia card operational in the HS-MMC mode, half the cycle of the clock signal is about 9.5 ns. In the case of executing the data output at the fall edge of the clock signal to secure the compatibility, the data delay time shall be below 4.5 ns in order to establish the data before 5 ns to the rise edge of the next clock signal.

Therefore, in view of the margin and the dispersion of the production process, etc., to execute the data output at a delay time from the fall edge of the clock signal will fail to meet the setup time. Accordingly, it becomes inevitable to execute the data output at a delay time from the rise edge of the clock signal. Now, assuming that the data output shall uniformly be executed at a delay time from the rise edge of the clock signal, there is a possibility that a host capable of conventionally operating with the SD card will create a problem in the operation thereof. That is, there occurs the incompatibility between a product conforming to the HS-MMC mode and a conventional product not conforming to the HS-MMC mode.

Therefore, an object of the invention is to provide a memory card conforming to the HS-MMC mode being the next-generation standard for the multimedia card, while securing the compatibility between the standard for the conventional multimedia card and the standard for the SD card.

The foregoing and other objects and novel features of the invention will become apparent from the descriptions and appended drawings of this specification.

A typical description of the invention disclosed herein is briefly given as follows.

According to one aspect of the invention, the memory card conforms to a first operation standard and a second operation standard, and it includes a non-volatile semiconductor memory having plural semiconductor memory cells, capable of storing given information, and a controller that executes operation instructions to the non-volatile semiconductor memory on the basis of commands issued from the outside. The controller controls a first data output timing that satisfies the first operation standard and the second operation standard, in a first operation mode, and controls a second data output timing that satisfies the first operation standard, in a second operation mode.

Another description of the present invention is briefly given as follows.

According to another aspect of the invention, the memory card conforms to the first operation standard and the second operation standard, and it includes: a non-volatile semiconductor memory having plural semiconductor memory cells, capable of storing given information; a controller that executes operation instructions to the non-volatile semiconductor memory on the basis of commands issued from the outside, controls a first data output timing that satisfies the first operation standard and the second operation standard, in a first operation mode, and controls a second data output timing that satisfies the first operation standard, in a second operation mode; and a power supply unit that generates a boosted power supply voltage from a power supply voltage supplied from the outside. The controller includes: a power consumption parameter register to which are set power consumption parameters that specify power consumptions; and a timing register to which is set one of the first data output timing and the second data output timing. The power supply unit switches the power supply voltage into the boosted power supply voltage and supplies the switched to the non-volatile semiconductor memory, (1) when the power consumption parameter of which value is larger than the default value corresponding to the minimum power consumption is set to the power consumption parameter register, (2) when the second data output timing is set to the timing register, or (3) when a parameter value larger than the default value is set to the power consumption parameter register and the second data output timing is set to the timing register.

BRIEF DESCRIPTION OF THE DRAWINGS

FIG. 2 is an explanatory chart of connector pins in the memory card in FIG. 1;

FIG. 13 is an explanatory chart showing an example for selecting the drive capability in the HS-MMC mode according to one embodiment of the invention;

FIG. 14 is an explanatory chart of modifying the system clock frequency by the power consumption parameter register in FIG. 4;

FIG. 20 is an explanatory chart showing an example for selecting a memory by various combinations of the parameters in the memory card in FIG. 19;

DETAILED DESCRIPTION OF THE PREFERRED EMBODIMENTS

The embodiment of the invention will be described based on the accompanying drawings.

Figure 1:
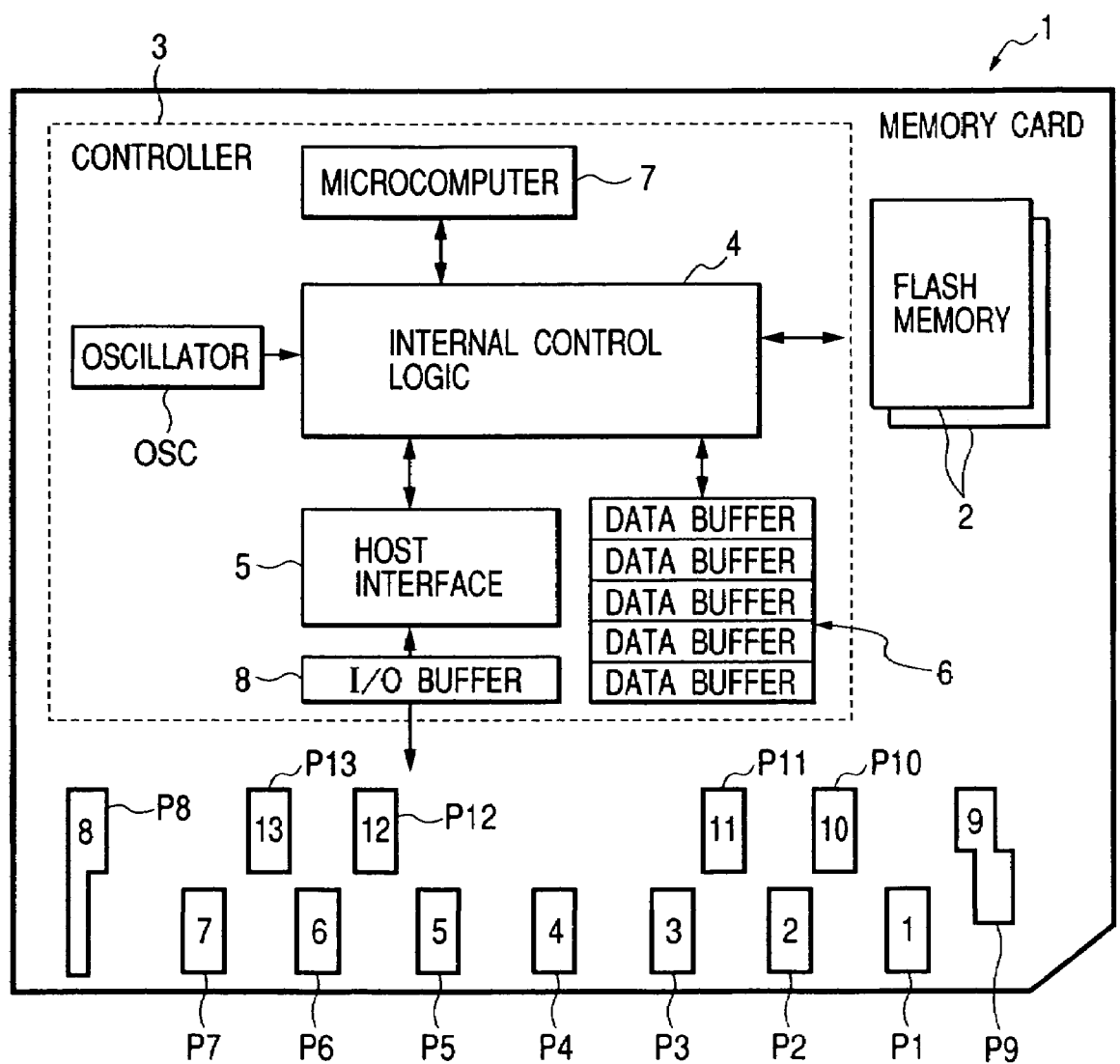
FIG. 1 is a block diagram of the card memory according to one embodiment of the invention.
Figure 3:
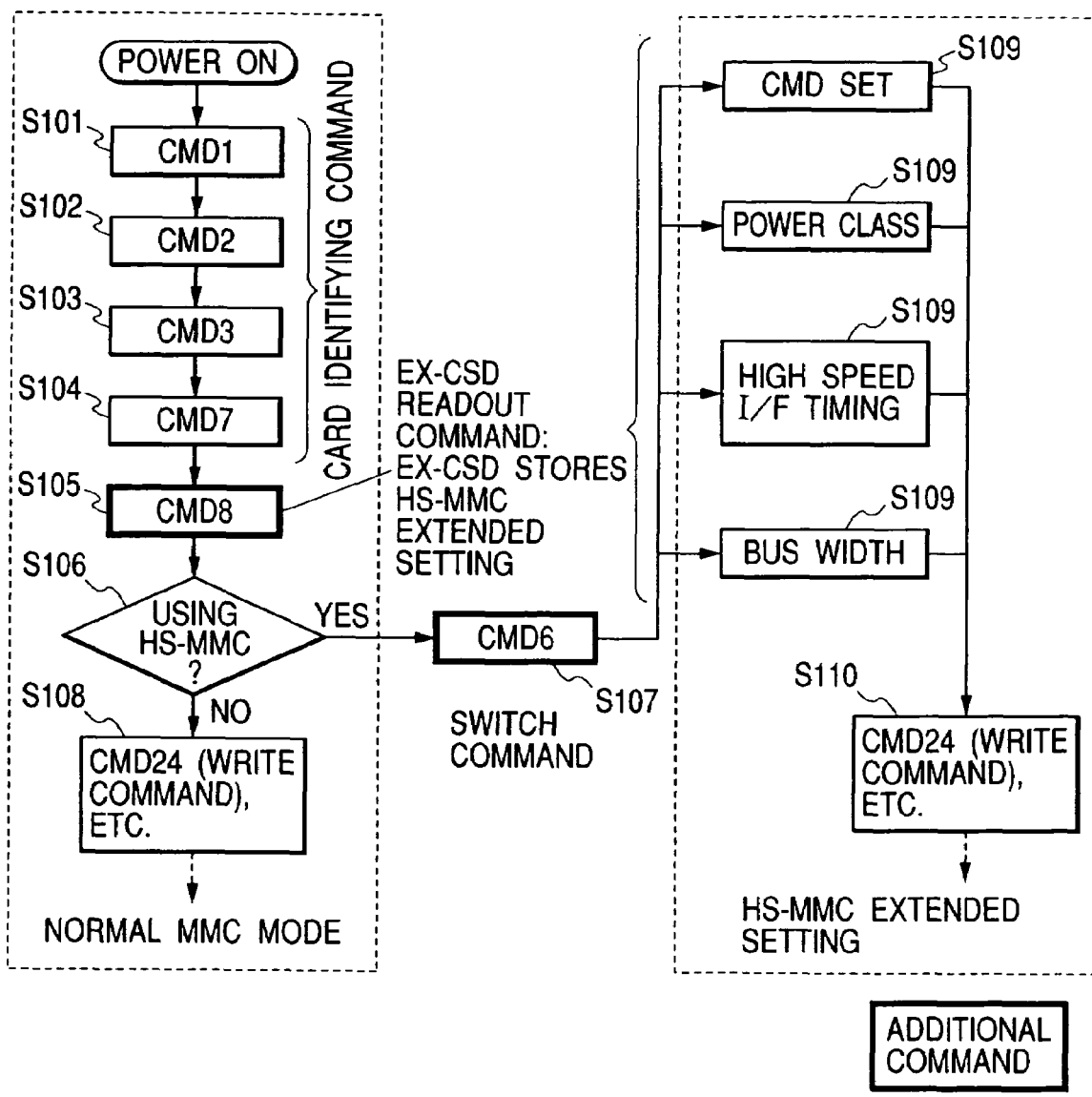
FIG. 3 is a flowchart of the switching operation of the MMC mode and the HS-MMC mode in the memory card in FIG. 1.
Figure 4:
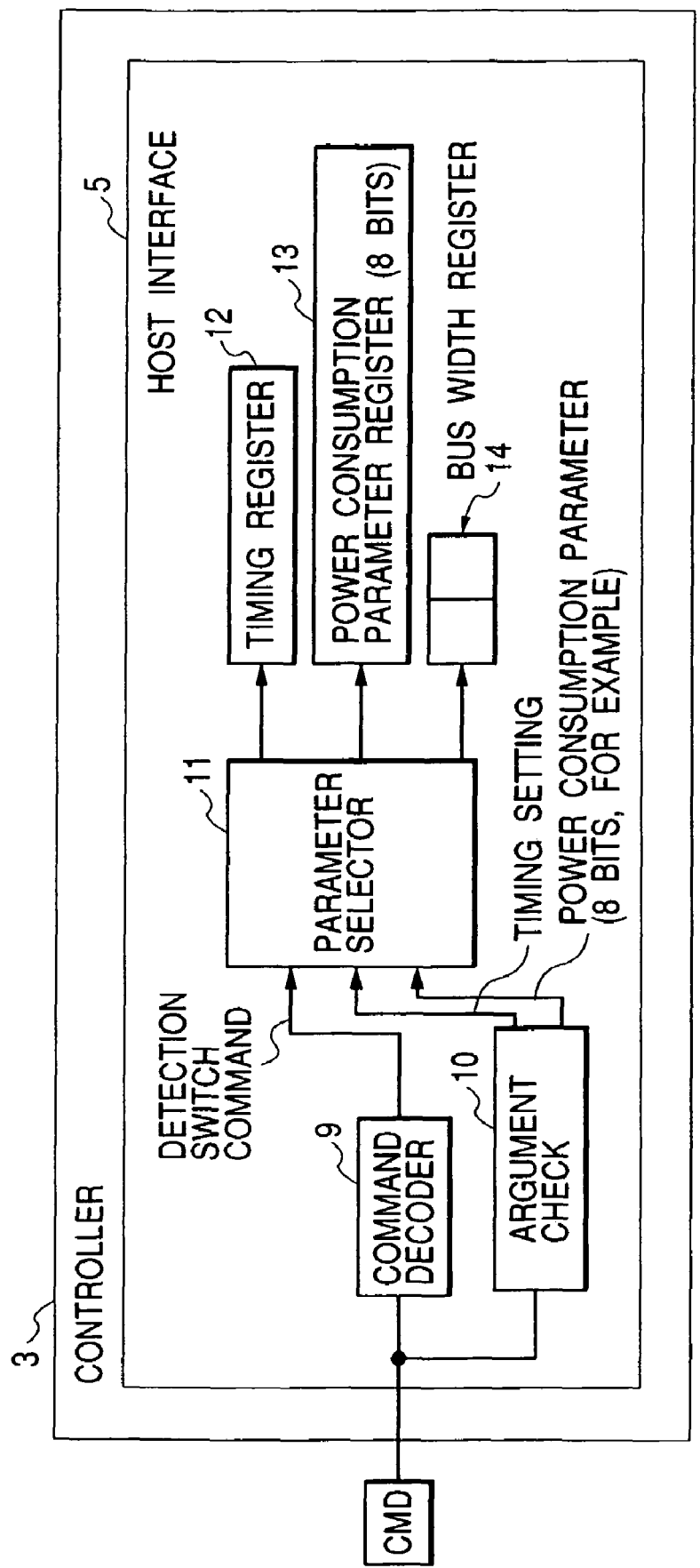
FIG. 4 is an explanatory chart of the configuration of registers in the host interface provided in the memory card in FIG. 1.
Figure 5:
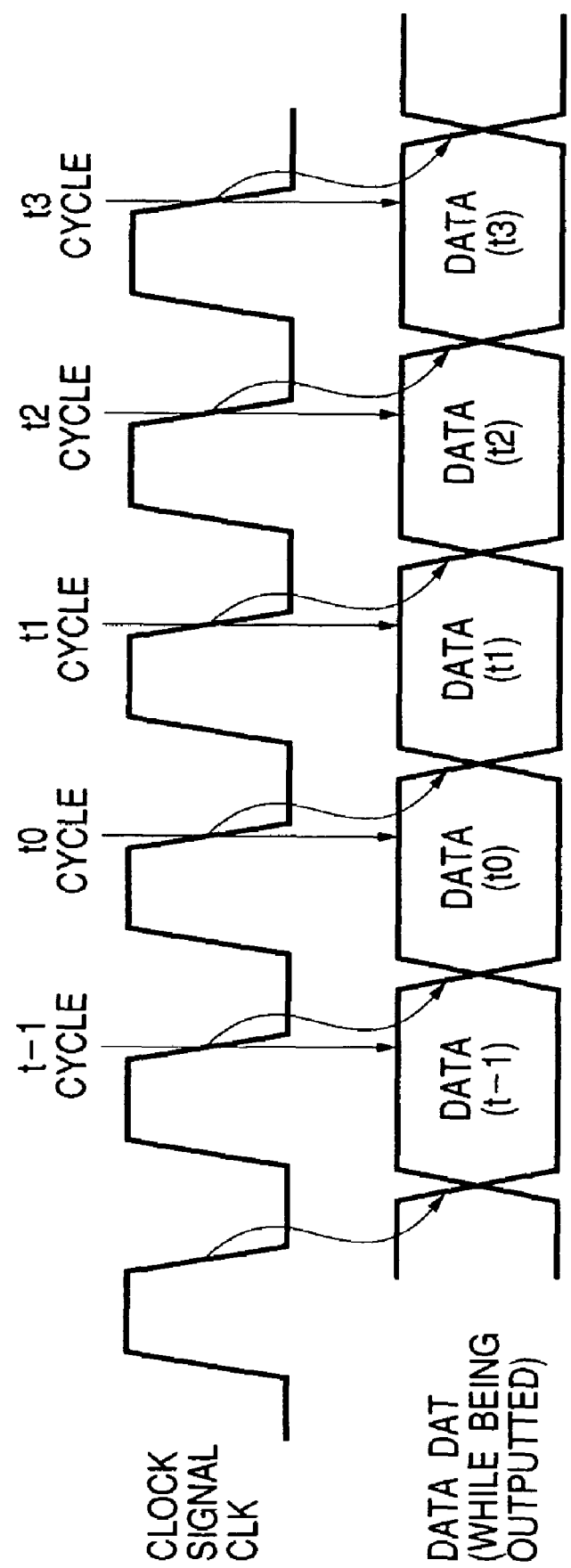
FIG. 5 is an explanatory chart of the data output timing when the memory card in FIG. 1 operates according to the MMC mode.
Figure 6:
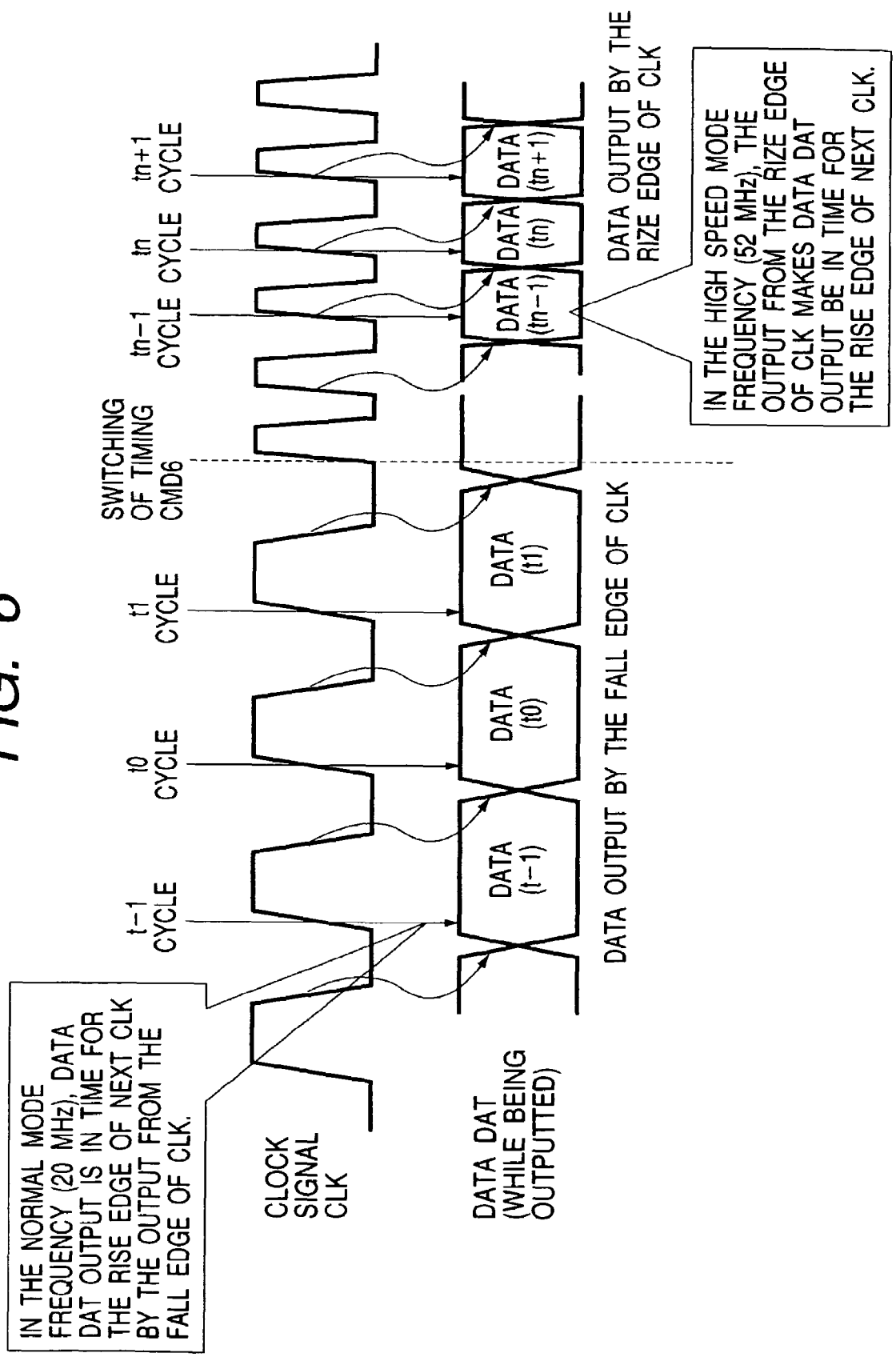
FIG. 6 is an explanatory chart of the data output timing when the mode in the memory card in FIG. 1 is transitioned from the MMC mode into the HS-MMC mode, and the timing edge is switched accordingly.
Figure 7:
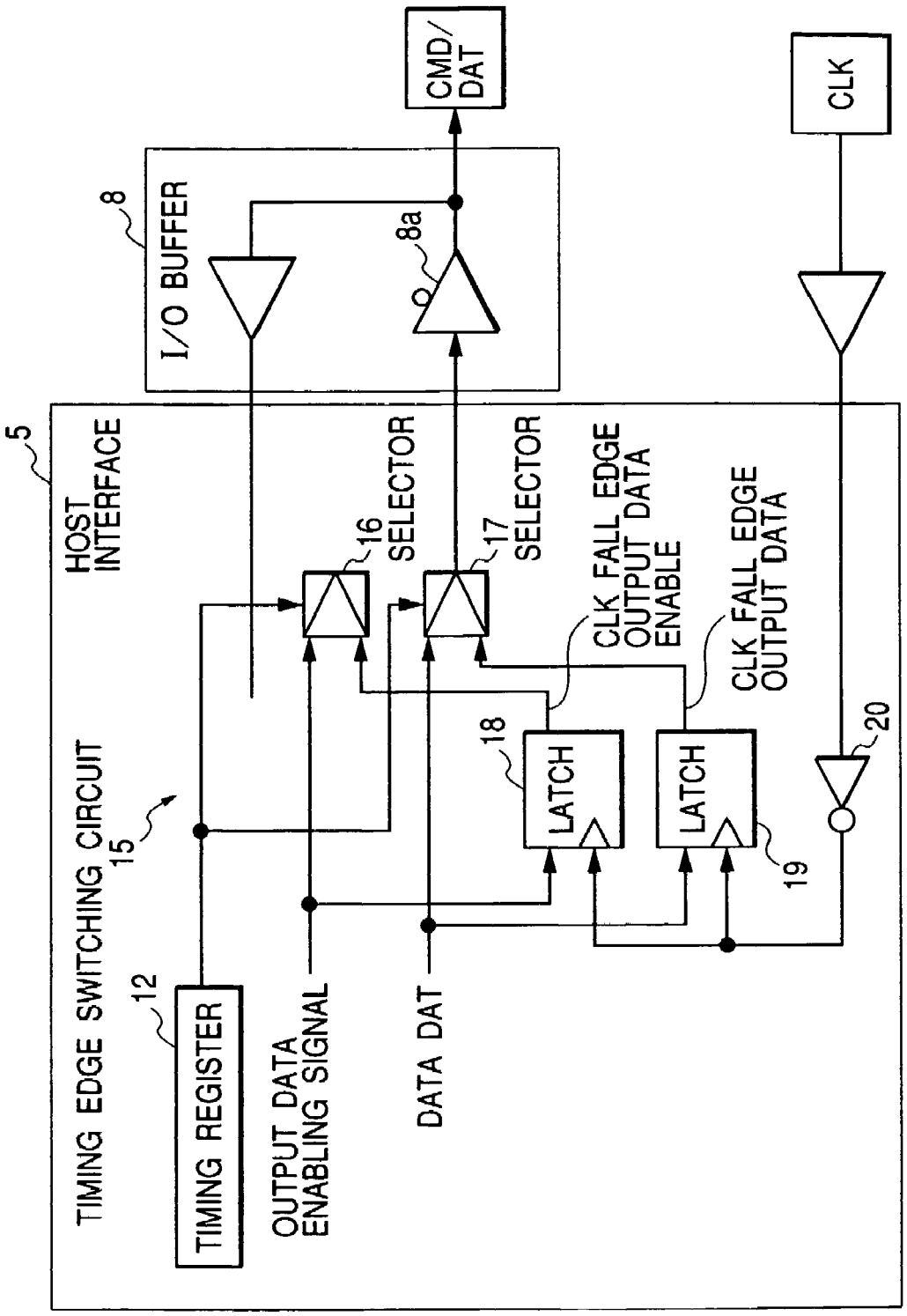
FIG. 7 is a circuit diagram showing one example of the timing edge switching circuit provided in the memory card in FIG. 1.
Figure 8:
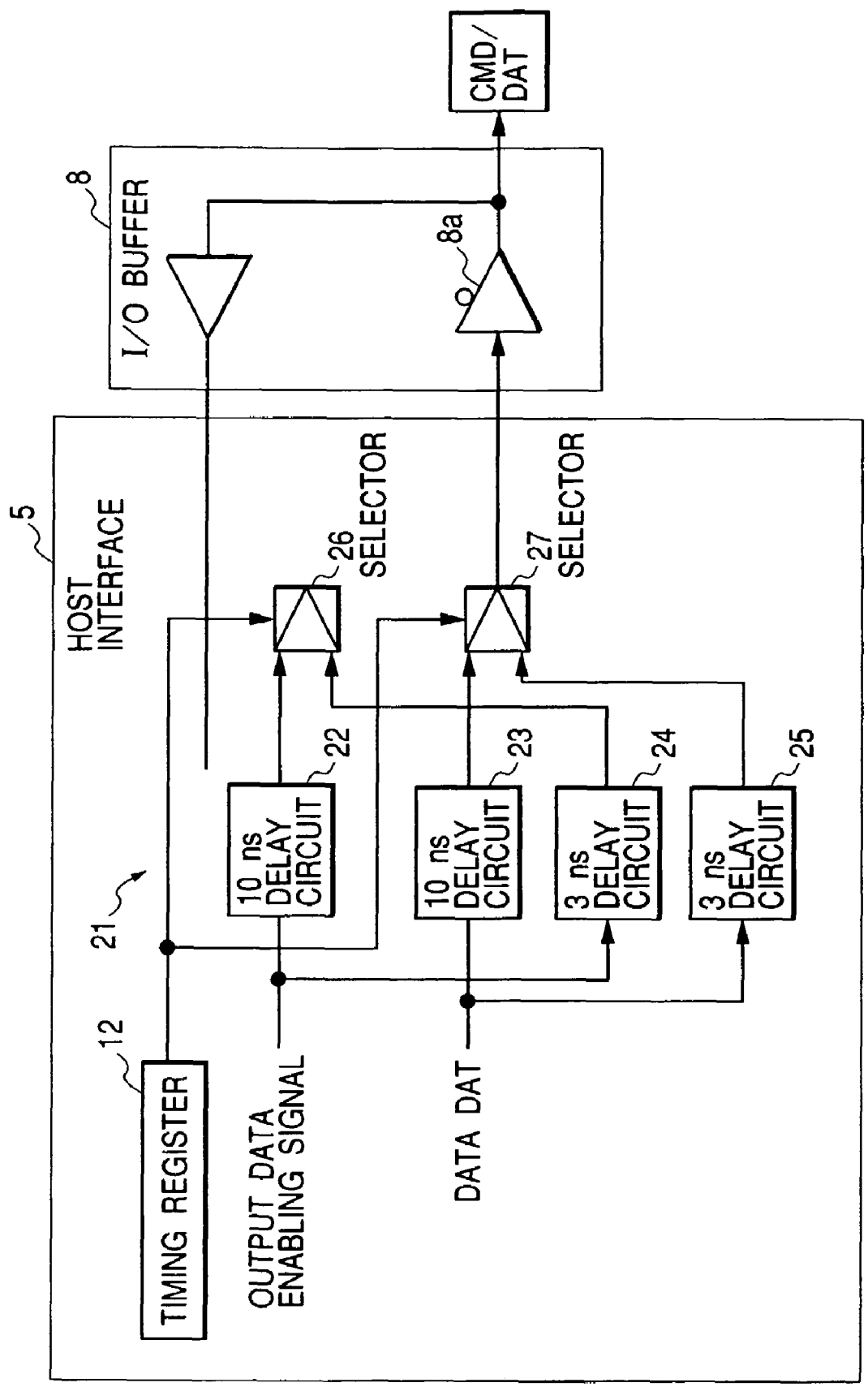
FIG. 8 is a circuit diagram showing one example of the timing delay switching circuit provided in the memory card in FIG. 1.
Figure 9:
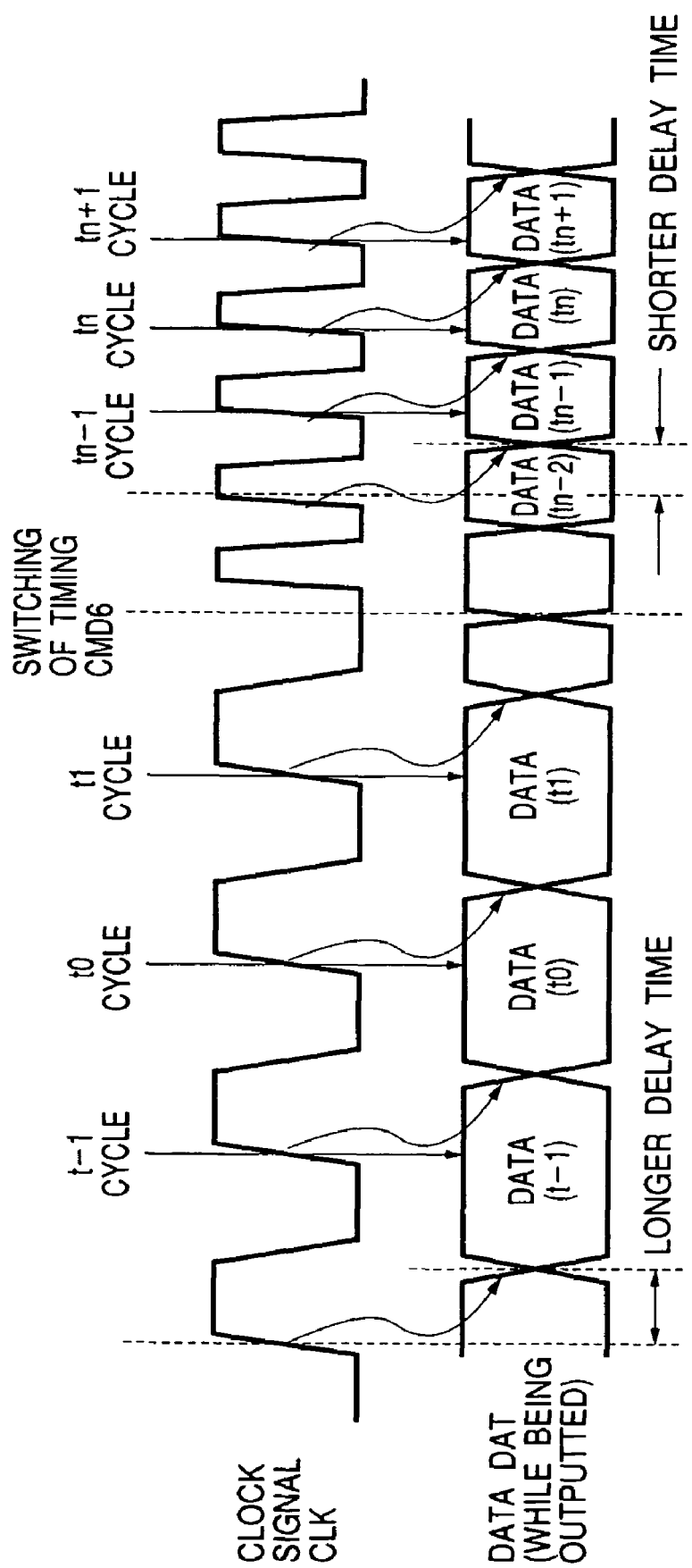
FIG. 9 is a timing chart of the data output switching by the timing delay switching circuit in FIG. 8.
Figure 10:
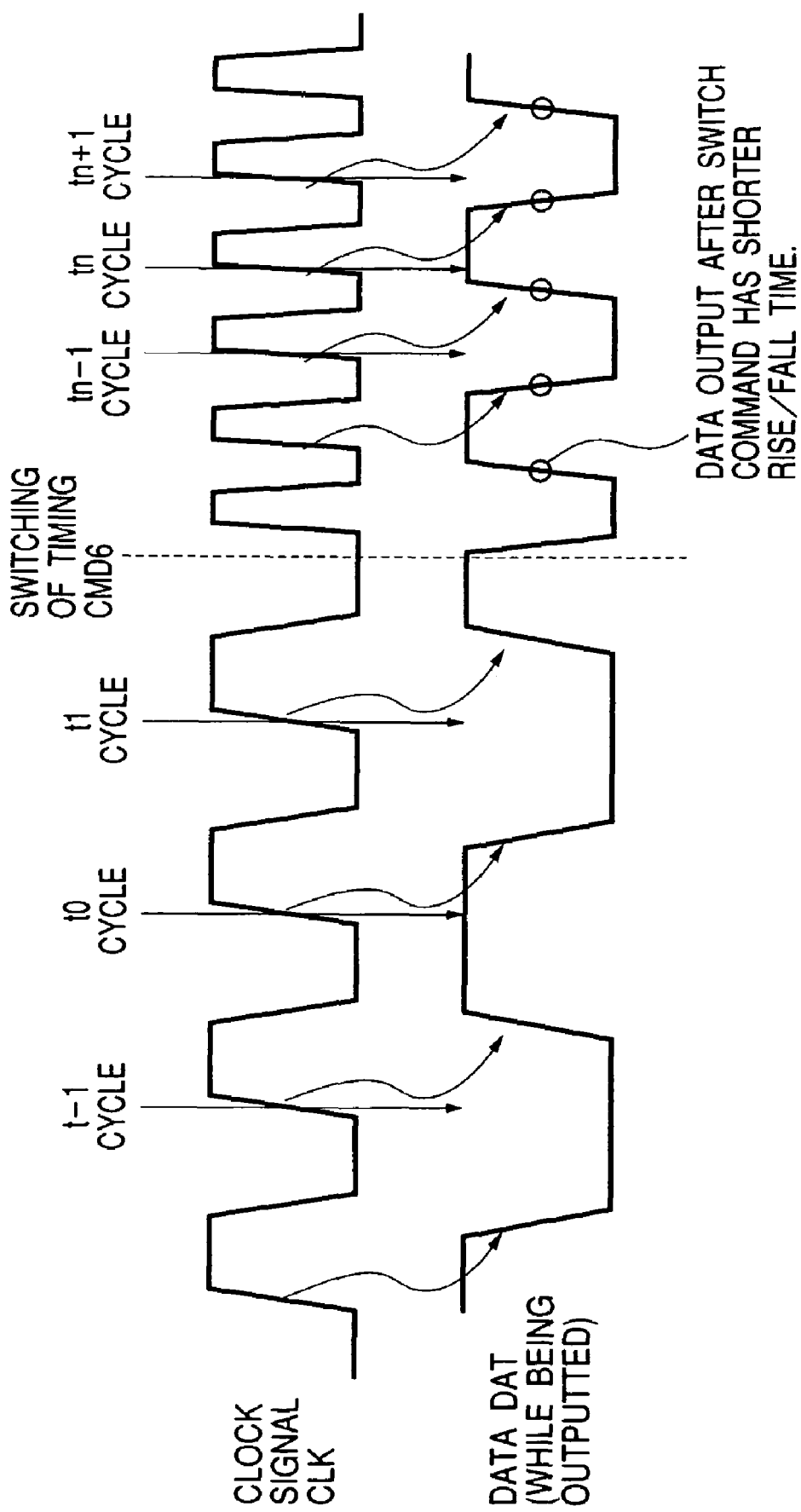
FIG. 10 is a timing chart of the data output switching, showing another example from FIG. 9.
Figure 11:
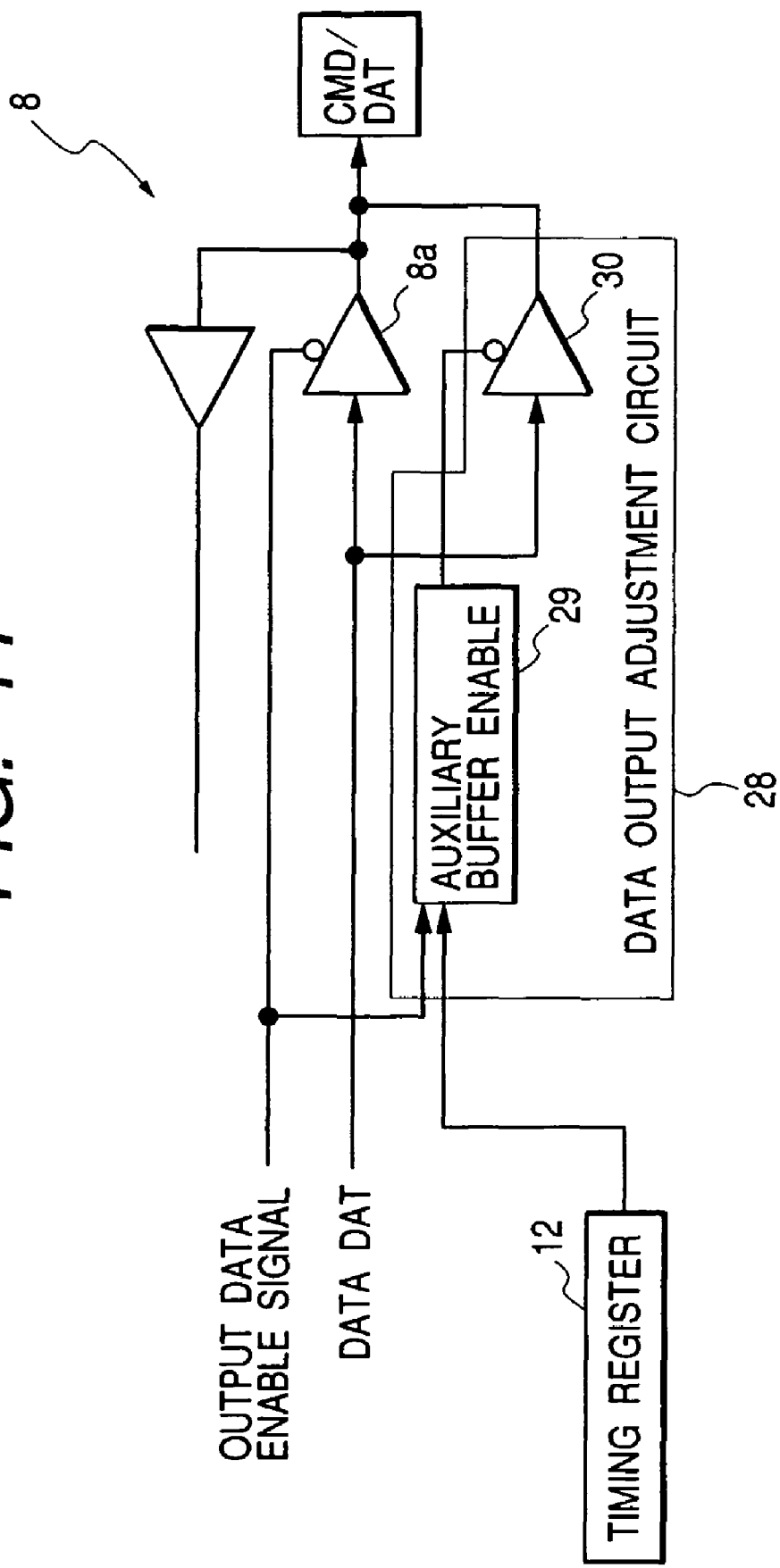
FIG. 11 is a circuit diagram showing one example of the data output adjustment circuit that adjusts the rise time/fall time of the data shown in FIG. 10.
Figure 12:
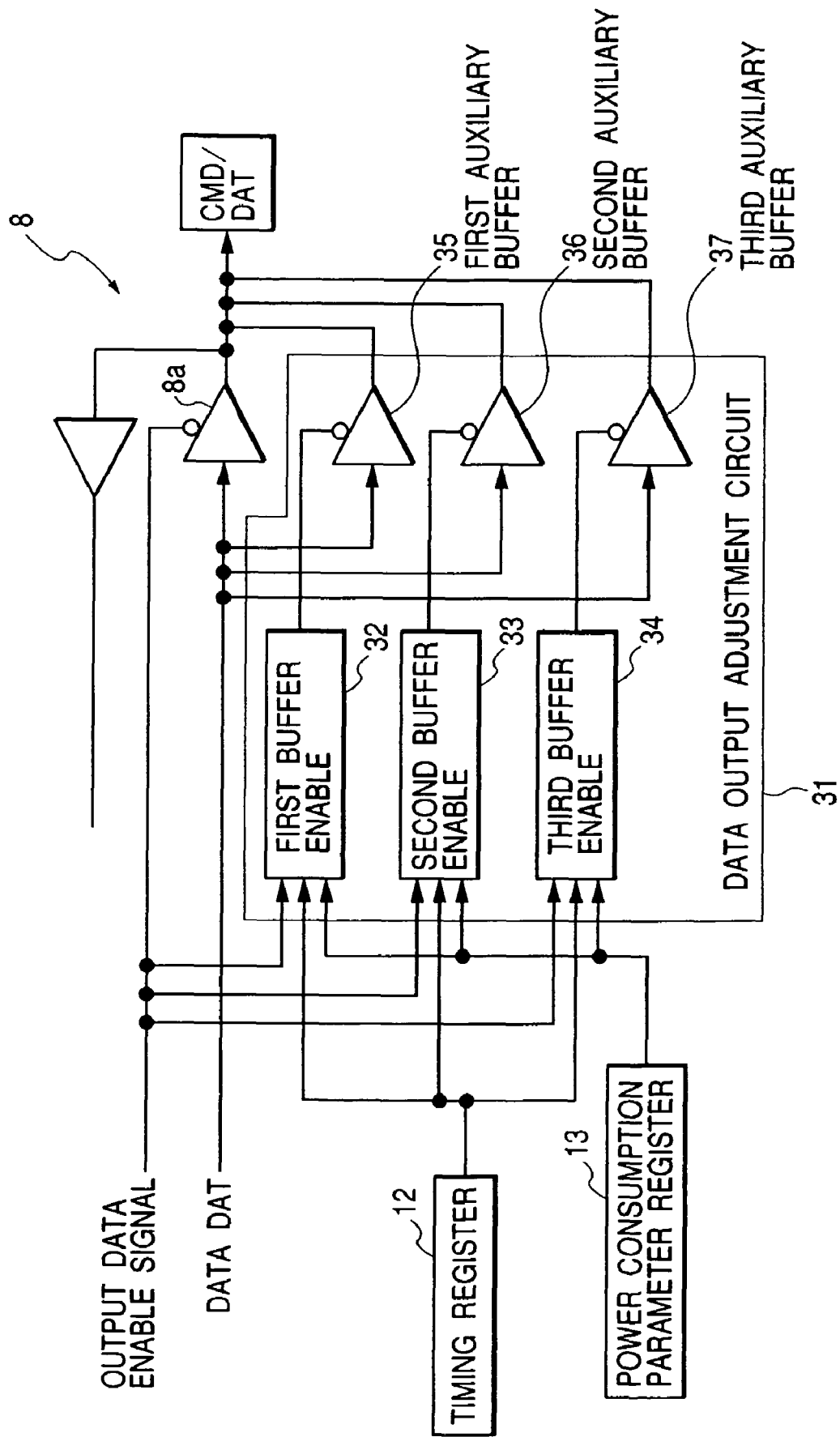
FIG. 12 is a circuit diagram showing another example of the data output adjustment circuit that adjusts the rise time/fall time of the data shown in FIG. 10.
Figures 15, 16:
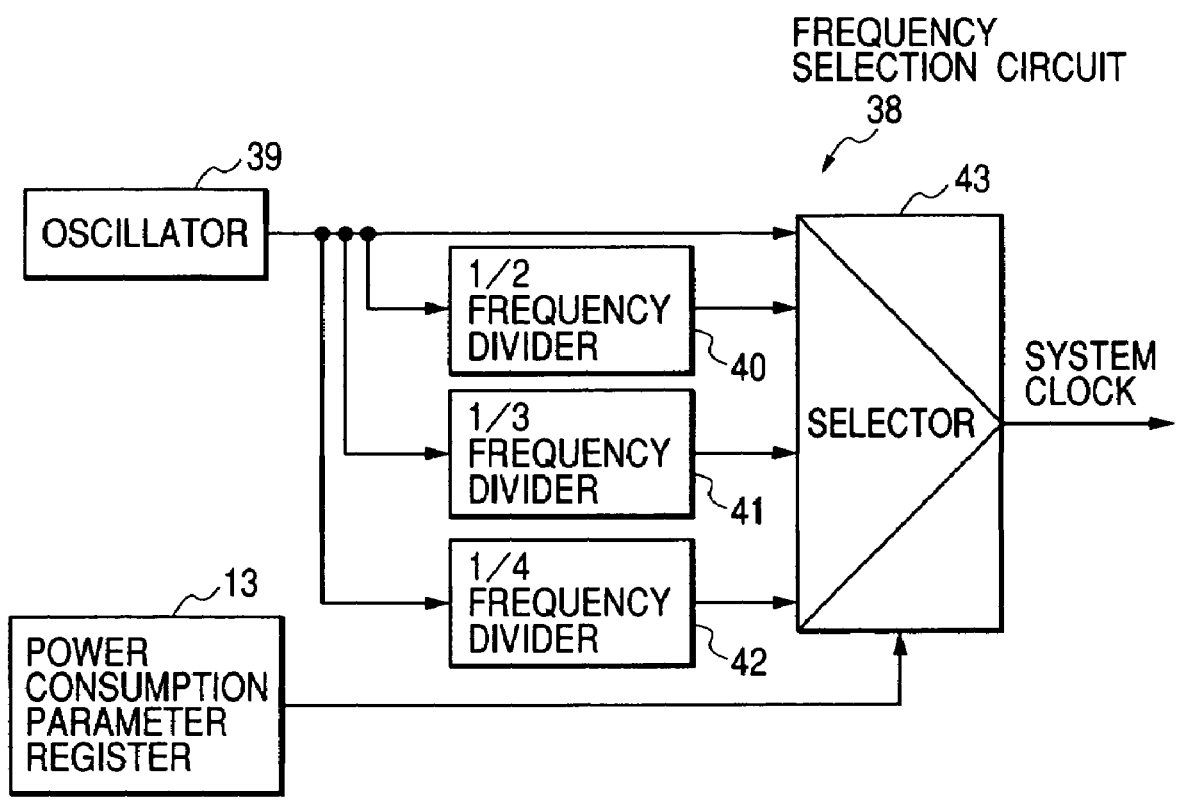
FIG. 15 is a block diagram of the frequency selection circuit that switches the system clock frequency shown in FIG. 14.
FIG. 16 is an explanatory chart showing the parallel operational number of flash memories corresponding to the parameters set to the power consumption parameter register in FIG. 4.
Figure 17:
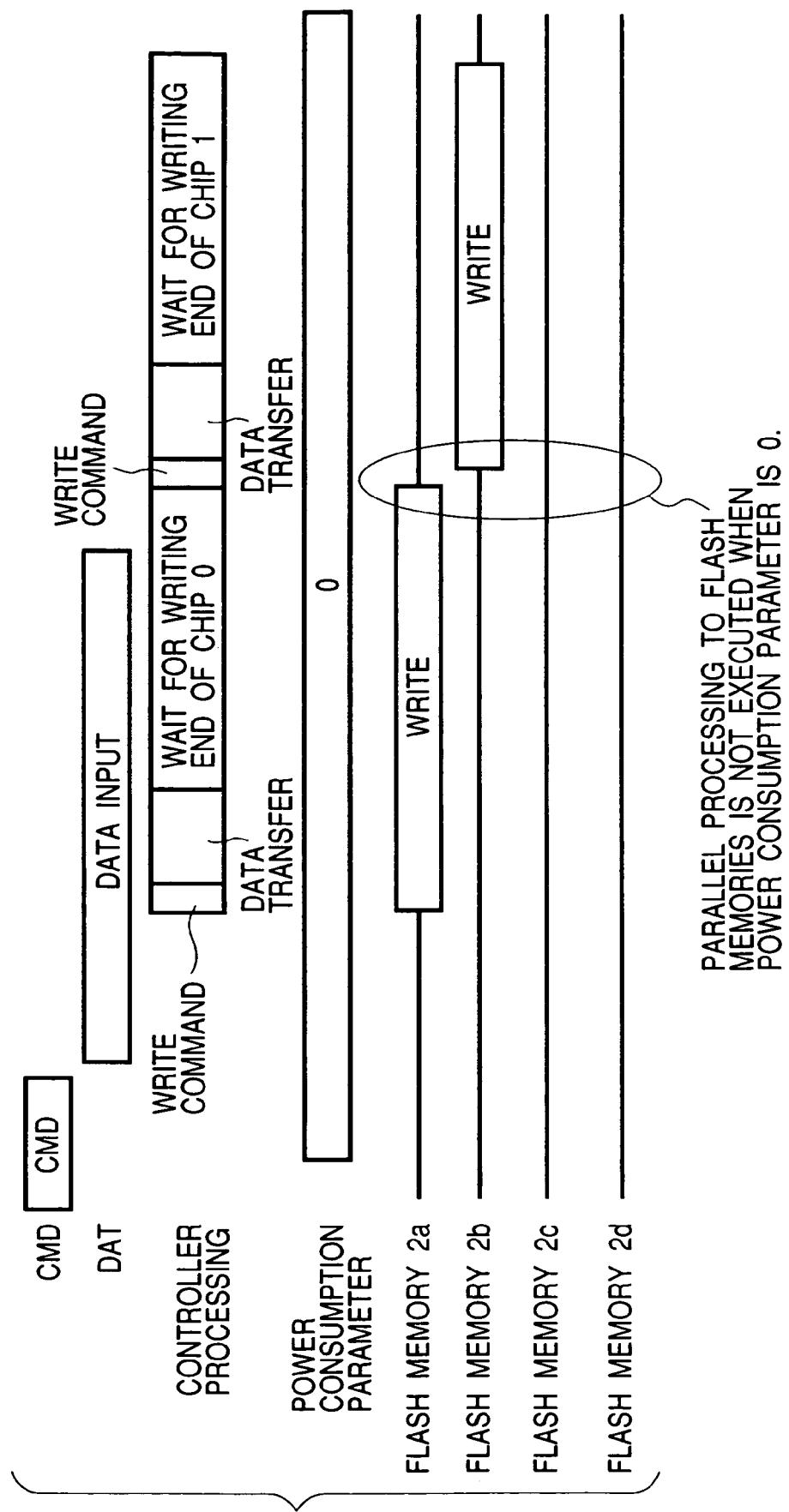
FIG. 17 is a timing chart of the memory card, when '0' is set to the power consumption parameter register in FIG. 4.
Figure 18:
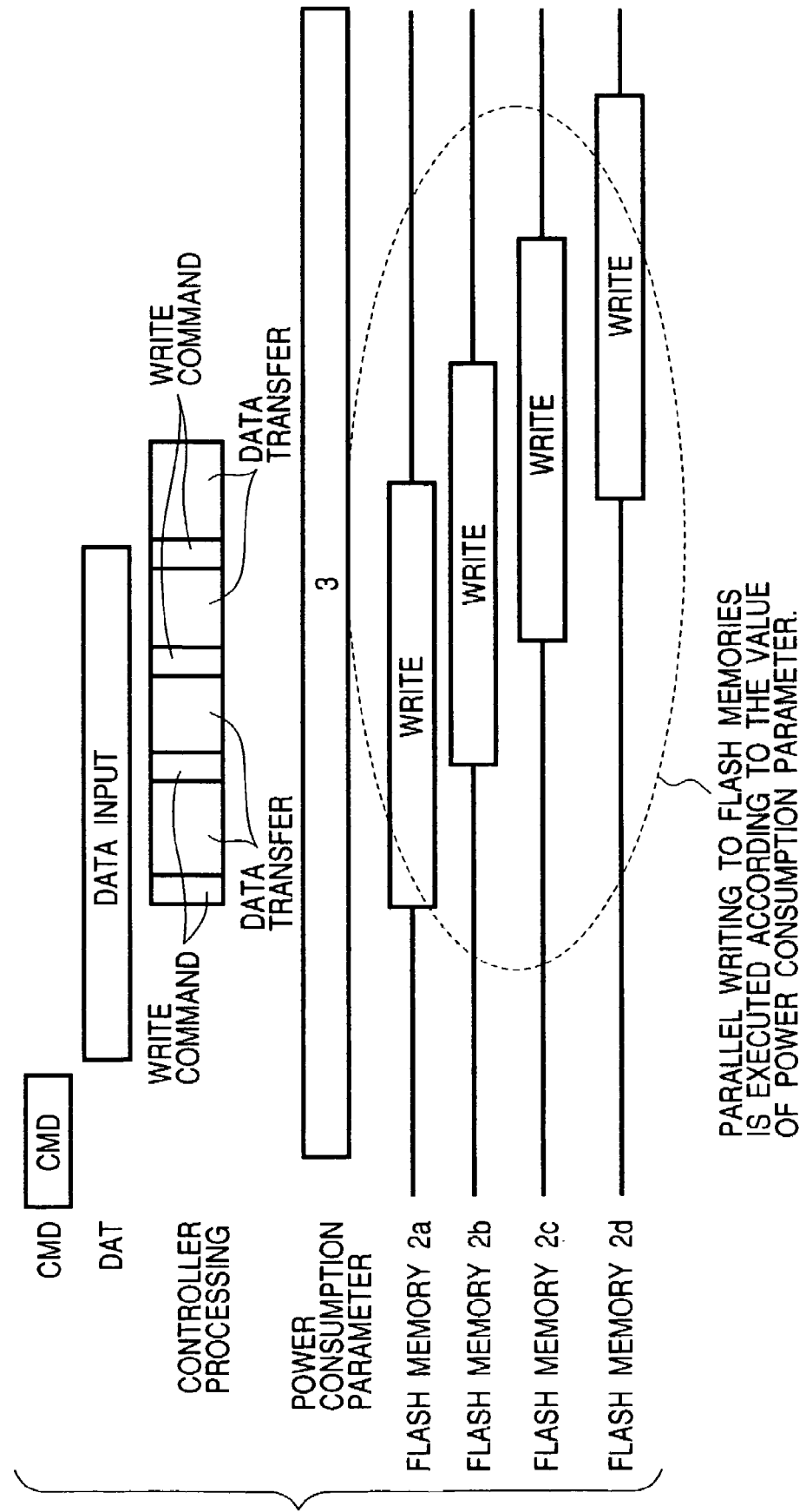
FIG. 18 is a timing chart of the memory card, when '3' is set to the power consumption parameter register in FIG. 4.
Figure 19:
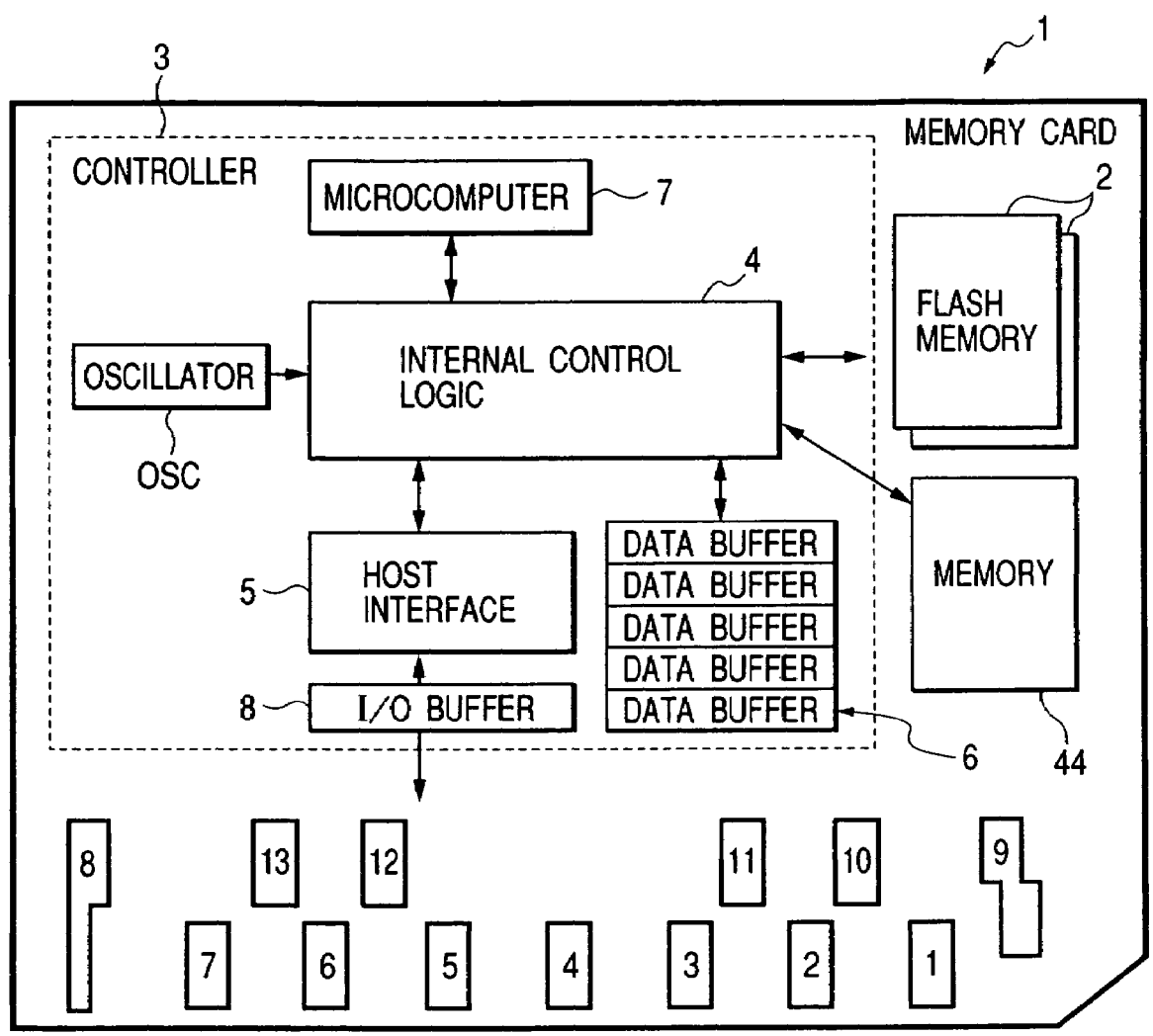
FIG. 19 is a block diagram of the card memory with the data transfer rate enhanced, according to one embodiment of the invention.
Figure 21:
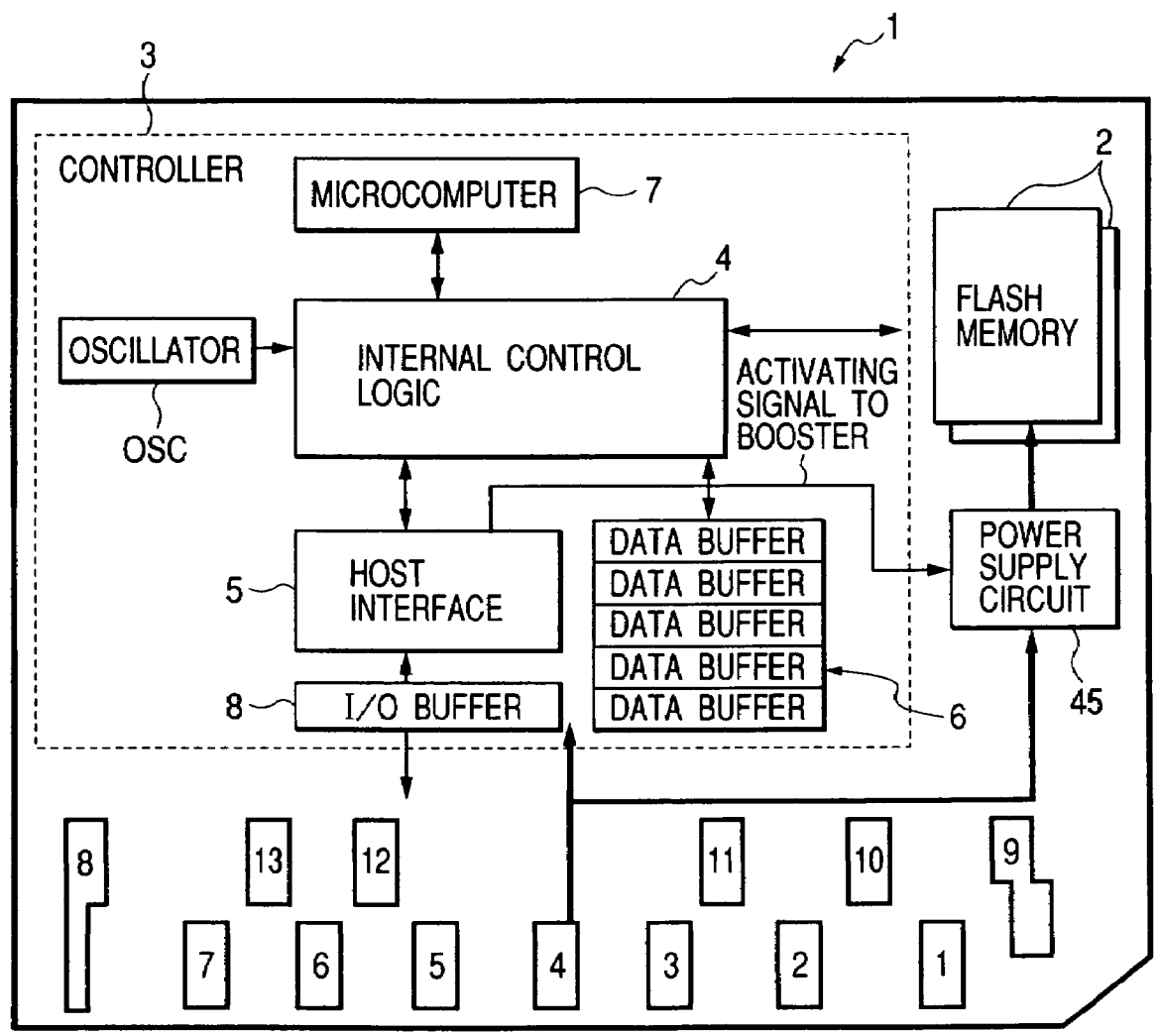
FIG. 21 is a block diagram of the card memory that supplies the operational voltage to the flash memories by various parameters, according to one embodiment of the invention.
Figure 22:
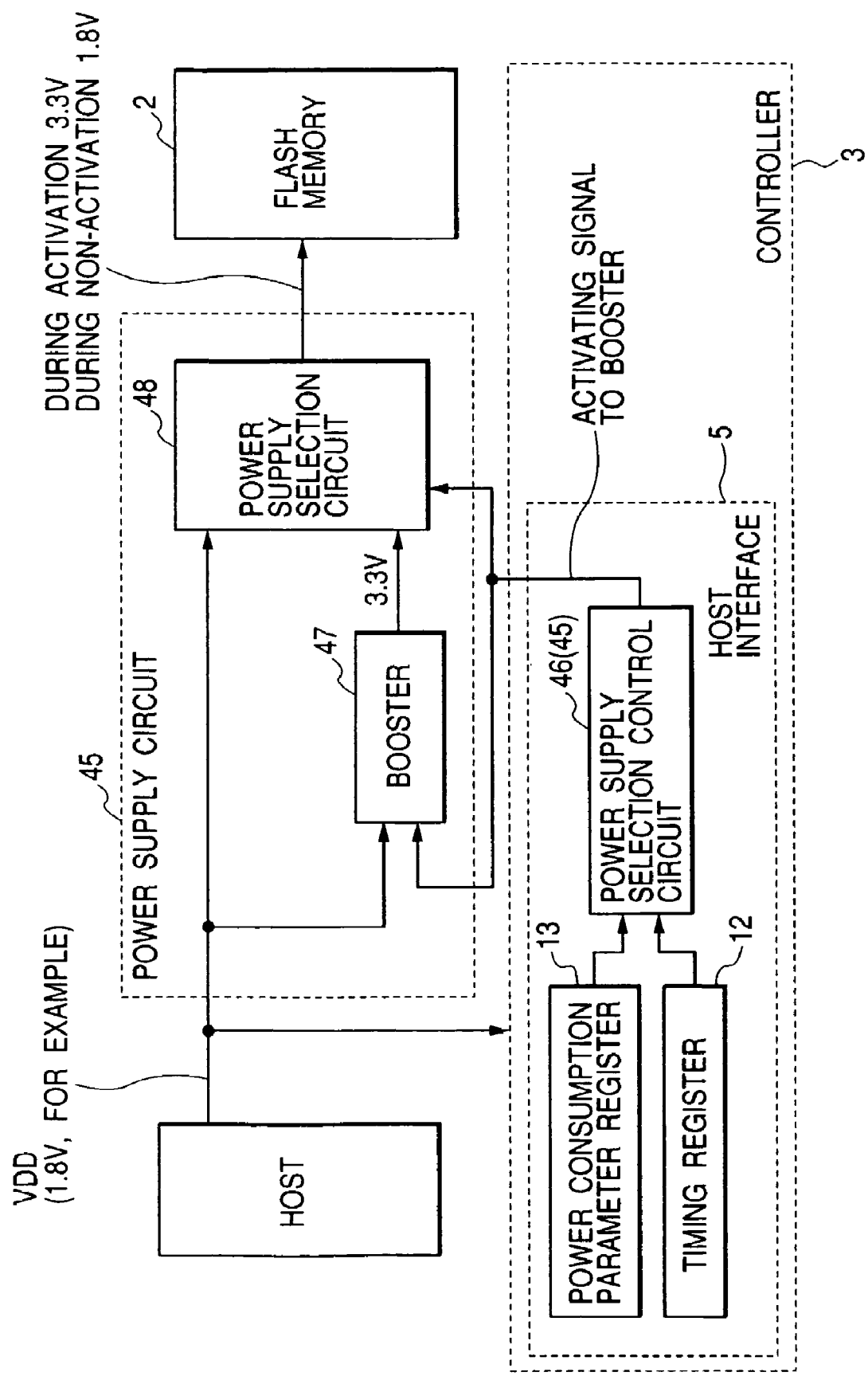
FIG. 22 is a block diagram of the power supply circuit provided in the memory card in FIG. 21.
Figure 23:
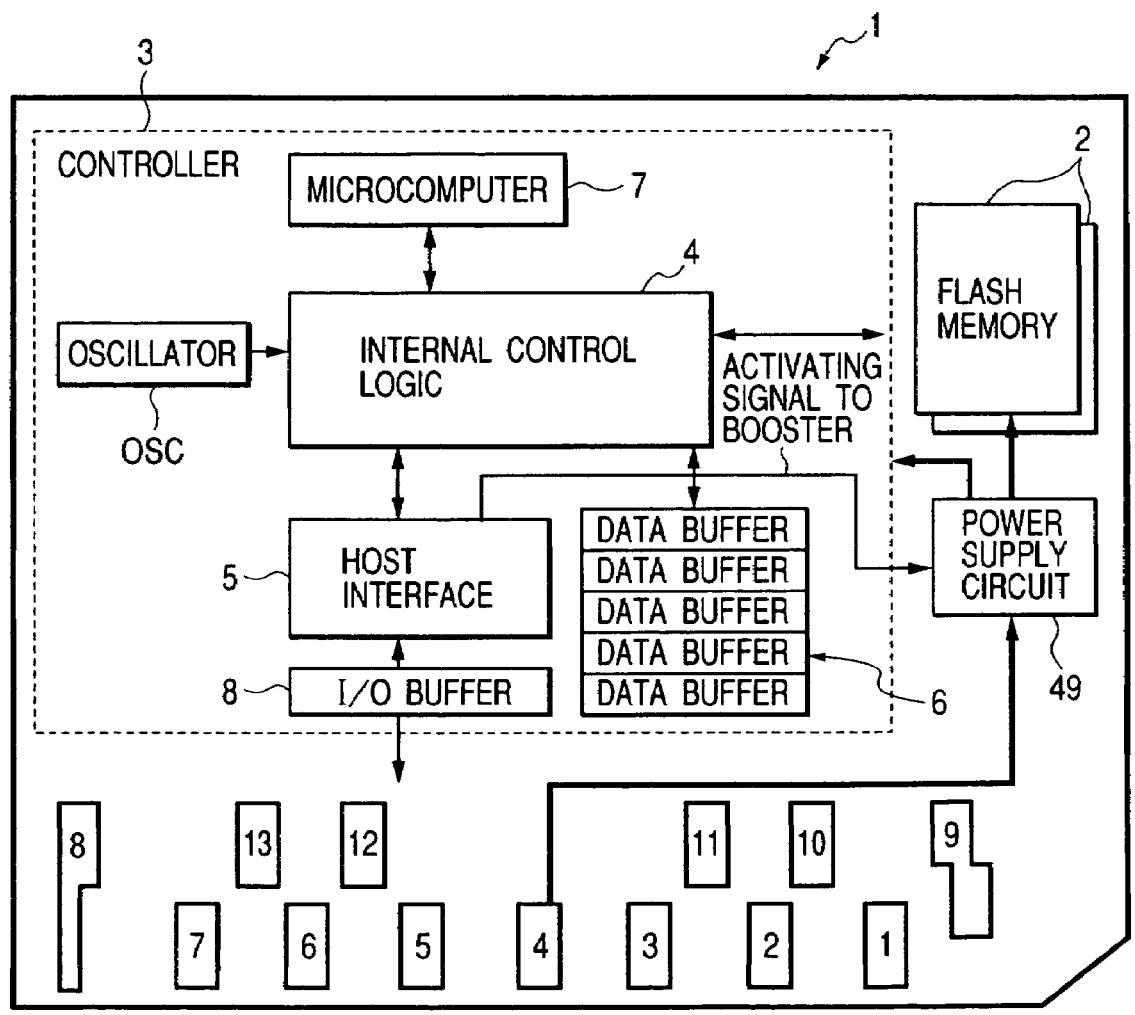
FIG. 23 is a block diagram showing another example of the memory card in FIG. 21.
Figure 24:
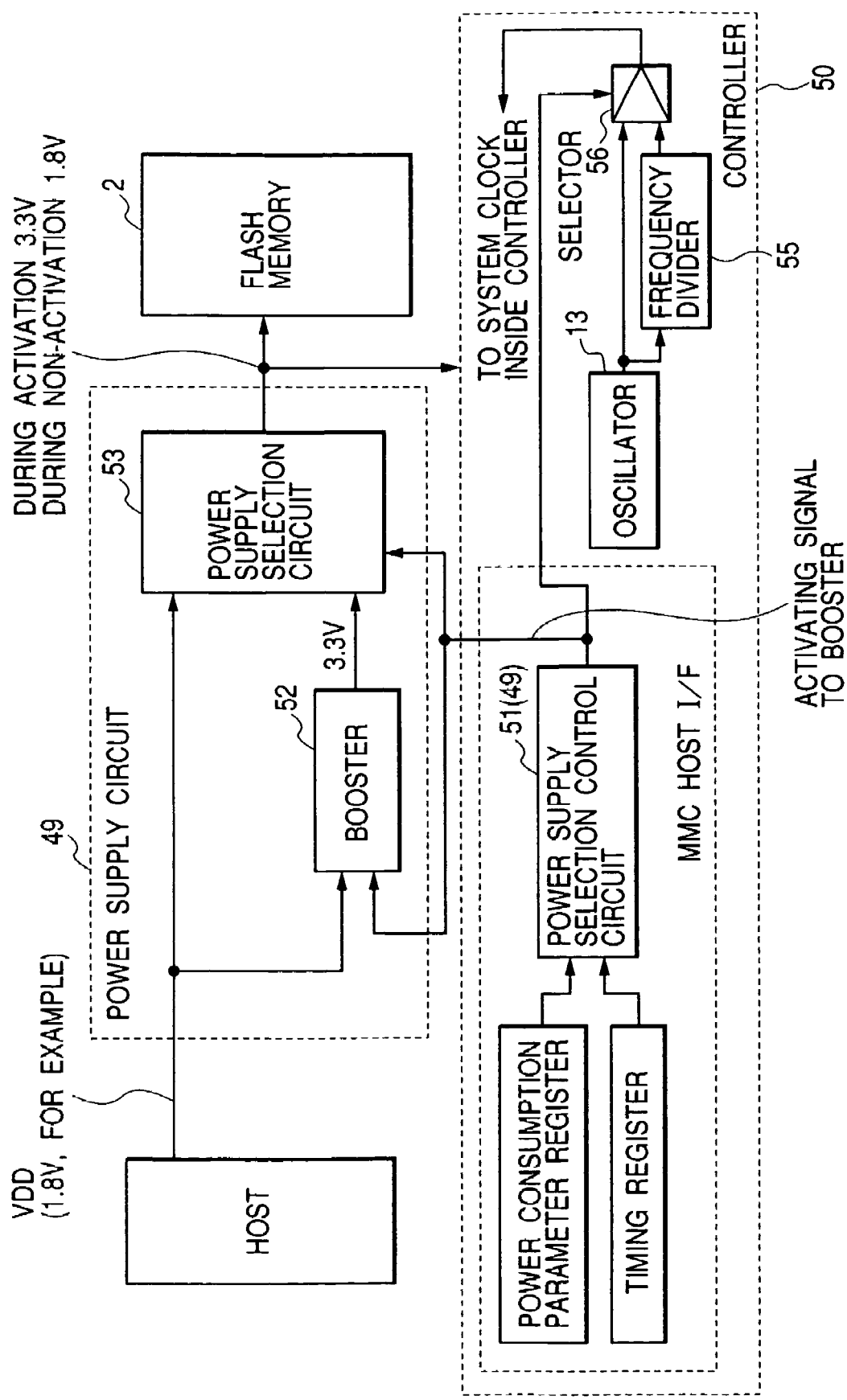
FIG. 24 is a block diagram of the power supply circuit provided in the memory card in FIG. 23, and the frequency selection circuit.
Figure 25:
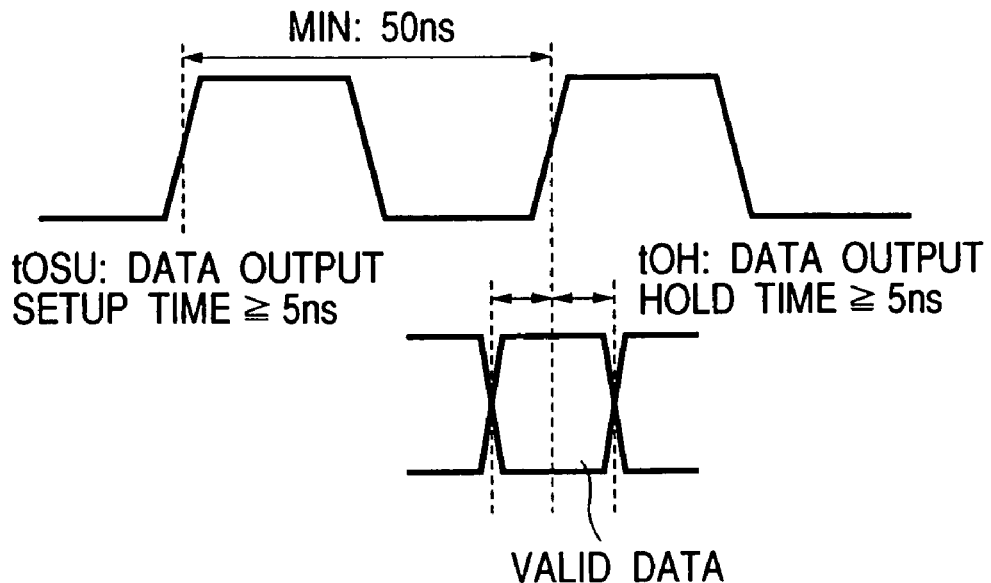
FIG. 25 is an explanatory chart showing the standard for the data output timing of the multimedia card in the MMC mode standardized by the MMCA.
Figure 26:
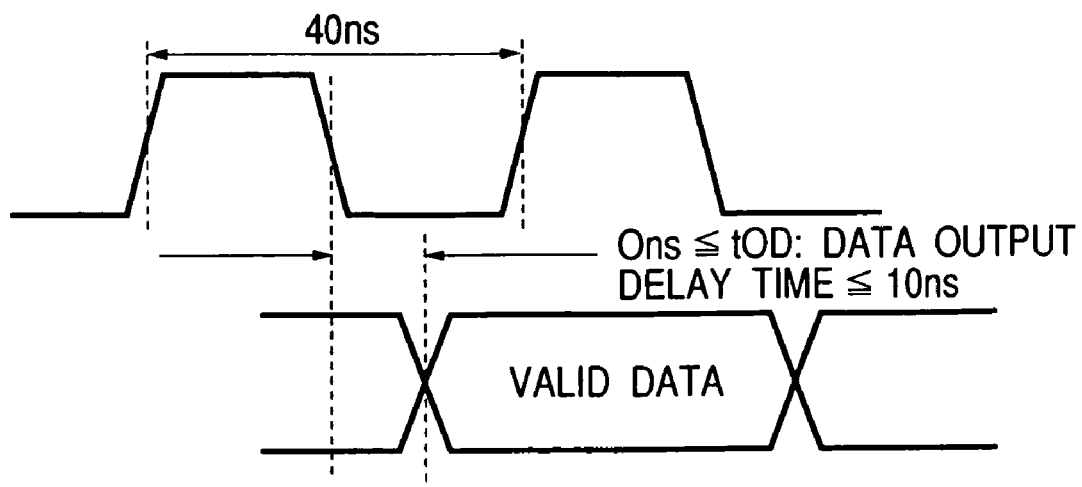
FIG. 26 is an explanatory chart showing the standard for the data output timing of the SD card standardized by the SDA.
Figure 27:
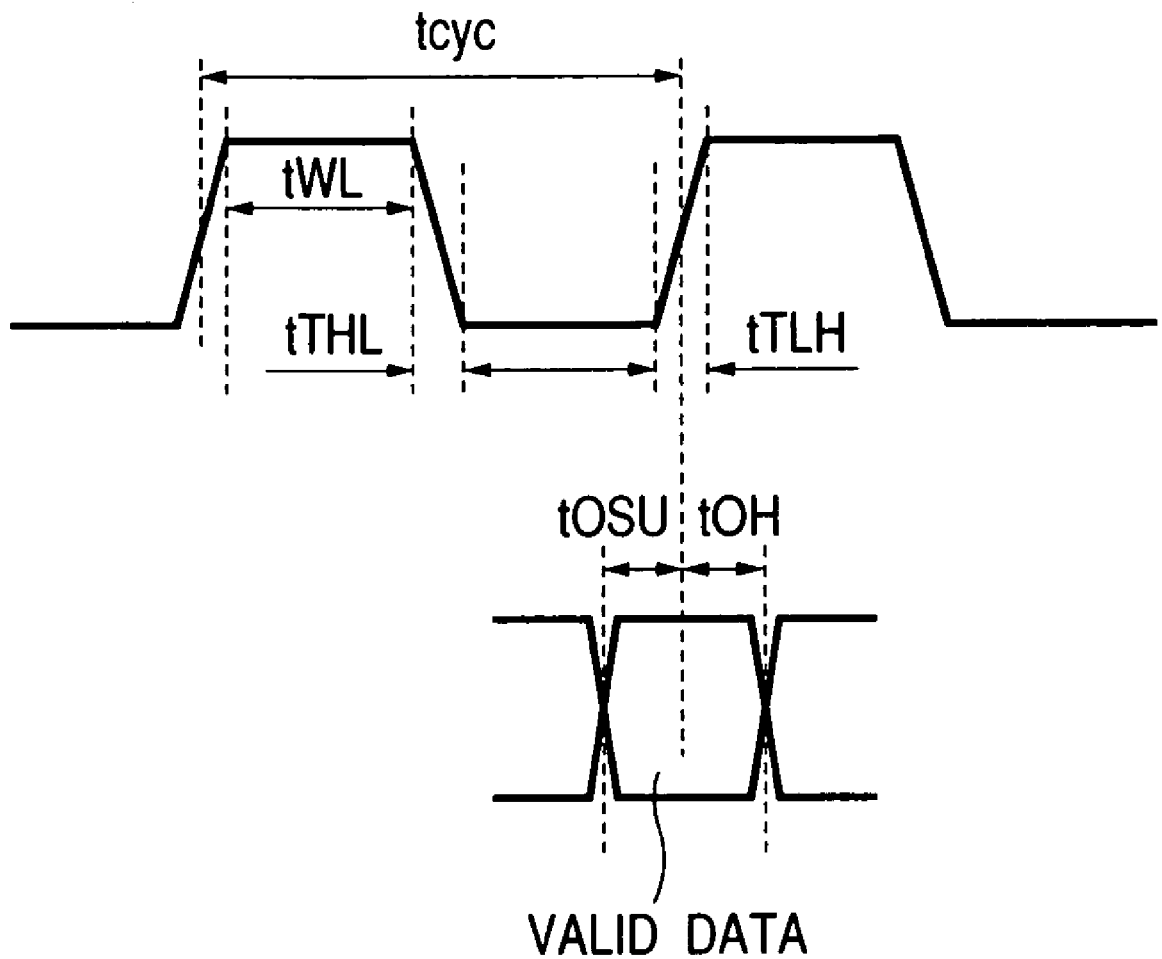
FIG. 27 is an explanatory chart showing the standard for the data output timing of the multimedia card in the HS-MMC mode standardized by the MMCA.

FIG. 1 is a block diagram of the card memory according to one embodiment of the invention; FIG. 2 is an explanatory chart of connector pins in the memory card in FIG. 1; FIG. 3 is a flowchart of the switching operation of the MMC mode and the HS-MMC mode in the memory card in FIG. 1; FIG. 4 is an explanatory chart of the configuration of registers in the host interface provided in the memory card in FIG. 1; FIG. 5 is an explanatory chart of the data output timing when the memory card in FIG. 1 operates according to the MMC mode; FIG. 6 is an explanatory chart of the data output timing when the mode in the memory card in FIG. 1 is transitioned from the MMC mode into the HS-MMC mode, and the timing edge is switched accordingly; FIG. 7 is a circuit diagram showing one example of the timing edge switching circuit provided in the memory card in FIG. 1; FIG. 8 is a circuit diagram showing one example of the timing delay switching circuit provided in the memory card in FIG. 1; FIG. 9 is a timing chart of the data output switching by the timing delay switching circuit in FIG. 8; FIG. 10 is a timing chart of the data output switching, showing another example from FIG. 9; FIG. 11 is a circuit diagram showing one example of the data output adjustment circuit that adjusts the rise time/fall time of the data shown in FIG. 10; FIG. 12 is a circuit diagram showing another example of the data output adjustment circuit that adjusts the rise time/fall time of the data shown in FIG. 10; FIG. 13 is an explanatory chart showing an example for selecting the drive capability in the HS-MMC mode according to one embodiment of the invention; FIG. 14 is an explanatory chart of modifying the system clock frequency by the power consumption parameter register in FIG. 4; FIG. 15 is a block diagram of the frequency selection circuit that switches the system clock frequency shown in FIG. 14; FIG. 16 is an explanatory chart showing the parallel operational number of flash memories corresponding to the parameters set to the power consumption parameter register in FIG. 4; FIG. 17 is a timing chart of the memory card, when '0' is set to the power consumption parameter register in FIG. 4; FIG. 18 is a timing chart of the memory card, when '3' is set to the power consumption parameter register in FIG. 4; FIG. 19 is a block diagram of the card memory with the data transfer rate enhanced, according to one embodiment of the invention; FIG. 20 is an explanatory chart showing an example for selecting a memory by various combinations of the parameters in the memory card in FIG. 19; FIG. 21 is a block diagram of the card memory that supplies the operational voltage to the flash memories by various parameters, according to one embodiment of the invention; FIG. 22 is a block diagram of the power supply circuit provided in the memory card in FIG. 21; FIG. 23 is a block diagram showing another example of the memory card in FIG. 21; FIG. 24 is a block diagram of the power supply circuit provided in the memory card in FIG. 23, and the frequency selection circuit; FIG. 25 is an explanatory chart showing the standard for the data output timing of the multimedia card in the MMC mode standardized by the MMCA; FIG. 26 is an explanatory chart showing the standard for the data output timing of the SD card standardized by the SDA; and FIG. 27 is an explanatory chart showing the standard for the data output timing of the multimedia card in the HS-MMC mode standardized by the MMCA.

In this embodiment, the memory card 1 represents the multimedia card used as an external storage media for the host in the digital video camera, mobile telephone, portable music player, and personal computer and so forth.

The memory card 1 operates on both the standard for the SD card (the second operation standard) and the standard for the multimedia card (the first operation standard). In the standard for the multimedia card, the memory card 1 operates in the two operation modes, namely, the MMC mode (the first operation mode) being the normal operation mode and the HS-MMC mode (the second operation mode) being the next-generation standard, which operates faster than the MMC mode.

The memory card 1 includes, as shown in FIG. 1, plural flash memories (non-volatile semiconductor memory) 2 and a controller 3. The controller 3 includes an internal control logic 4, a host interface 5, a data buffer 6, a microcomputer 7, an I/O (Input/Output) buffer 8, and an oscillator OSC.

The flash memories 2 serve as the non-volatile semiconductor memory capable of electrically rewriting/erasing the data. The system area of the flash memories 2 stores the data of the CSD and EX-CSD. The CSD represents a card characteristic register, which stores all the information relating to the memory card 1 in the MMC mode. The EX-CSD stores all the information relating to the memory card 1 in the HS-MMC mode.

The internal control logic 4 serves as the interface with the flash memories 2, data buffer 6, and microcomputer 7. The host interface 5 receives the commands from the host that instruct the operations such as the writing/reading/erasing being inputted and outputted through the I/O buffer 8, and inputs and outputs the data necessary for these operations.

The data buffer 6 temporarily stores the data being inputted and outputted from the host and the flash memories 2. The microcomputer 7 administers all the controls in the controller 3.

Further, the memory card 1 includes connector pins P1 to P13 for connecting the card to the host, located on the lower part thereof from right to left, as shown in FIG. 1. These connector pins P1 to P13 are arrayed in the upper/lower two rows. The connector pins P1 to P7 are located on the lower row, and the connector pins P8 to P13 are located on the upper row.

The memory card 1 includes a cutout part on the lower corner thereof. The connector pin P1 is located nearest to the cutout on the lower row, which is the $1^{st}$ Pin; and the connector pin P7 is located farthest to the cutout on the lower row, which is the $7^{th}$ Pin.

The connector pin P8 is located left on the upper row to the connector pin P7, and the connector pin P9 is located right on the upper row to the connector pin P1. And, the connector pins P10 to P13 are located in line between the pin P9 and the pin P8. The connector pins P8 to P13 correspond to the $8^{th}$ Pin through the $13^{th}$ pin, respectively.

FIG. 2 shows a pin configuration of the connector pins P1 to P13. The connector pins P1 and P7 to P13 input and output the data. The connector pin P2 inputs and outputs the command.

The connector pins P3 and P6 are connected to the ground being the reference potential VSS, and the connector pin P4 is connected to the power supply voltage VCC. The connector pin P5 inputs the clock signal from the outside.

Next, the operation of the memory card 1 of this embodiment will be described.

The switching operation of the MMC mode and the HS-MMC mode will be outlined with reference to the flowchart in FIG. 3.

In the first place, as the memory card 1 is inserted into a memory slot, etc., provided to the host, the power supply voltage VCC is supplied to the memory card 1 through the connector pin for the memory slot.

The host sequentially outputs the initialization command 'CMD1' to check the operational voltage range of the memory card 1 and check if the internal processing of the memory card 1 is finished, CID (Card Identification Number) sending request command 'CMD2', RCA (Relative Card Address) setting command 'CMD3', and command 'CMD7' for selecting the memory card to be accessed (step S101 to S104), thus executing the authentication of the memory card 1.

Then, the host outputs the command 'CMD8' for reading out the EX-CSD (Step S105). When the EX-CSD of the memory card 1 is read out by the command 'CMD8', the host recognizes that the memory card 1 is the memory card conforming to the HS-MMC mode (step S106), and outputs the switch command 'CMD6' (step S107)

When the EX-CSD of the memory card 1 is not read out by the command 'CMD8', the host recognizes that the memory card 1 is the memory card not conforming to the HS-MMC mode, outputs the write command 'CMD24', etc., and executes the operation control according to the normal MMC mode (step S108).

In the processing at step S107, the switch command 'CMD6' from the host sets to switch the mode of the memory card 1 into the HS-MMC mode (step S109).

The parameters that can be switched by the processing at step S109 are: command setting (CMD Set), operation timing of the host interface in the HS-MMC mode (High Speed I/F Timing), switching of the power consumption (Power Class), and switching of the bus width with the host (Bus Width). As the bus width, ×1, ×4, ×8, etc., for example, are available. Thereafter, the host outputs the write command 'CMD24', etc., and executes the operation control according to the HS-MMC mode (step S110).

Now, the switching of the HS-MMC mode in the processing at step S109 will be explained.

FIG. 4 illustrates a circuit configuration of the registers in the host interface 5.

The host interface 5 includes a command decoder 9, an argument check 10, a parameter selector 11, a timing register 12, a power consumption parameter register 13, a bus width register 14, and so forth.

The inputs of the command decoder 9 and argument check 10 are connected to receive the command CMD outputted from the host. The command decoder 9 detects the switch command 'CMD6' from the inputted command CMD, and outputs the detection signal to the parameter selector 11.

The argument check 10 checks the arguments and outputs the values to be set to the timing register 12, power consumption parameter register 13, and bus width register 14 to the parameter selector 11. The timing register 12 stores the parameter of the High Speed I/F Timing.

The power consumption parameter register 13 stores the parameters for switching the Power Class in the memory card 1. The bus width register 14 stores the parameters of the Bus Width.

The parameters '0' (default) to '3' are set to the power consumption parameter register 13. When the parameter '0' is set to the power consumption parameter register 13, the power consumption of the memory card 1 becomes the minimum, and the current consumption of the memory card 1 is about 100 mA, for example.

When the parameter '1' is set to the power consumption parameter register 13, the current consumption of the memory card 1 is about 150 mA; when the parameter '2' is set to the power consumption parameter register 13, the current consumption of the memory card 1 is about 200 mA.

When the parameter '3' is set to the power consumption parameter register 13, the power consumption of the memory card 1 becomes the maximum, and the current consumption of the memory card 1 is about 250 mA.

The parameter selector 11 sets various types of the parameters outputted from the argument check 10 to the timing register 12, power consumption parameter register 13, and bus width register 14 on the basis of the detection signal outputted from the command decoder 9.

Thus, the host interface 5 switches the High Speed I/F Timing, Power Class, and Bus Width on the basis of the parameters set to the arguments (32 bits, for example) of the commands.

FIG. 5 illustrates the data output timing of the memory card 1 in the MMC mode, and FIG. 6 illustrates the data output timing of the memory card 1 when the MMC mode is transitioned into the HS-MMC mode, and the timing edge is switched accordingly.

In FIG. 5 and FIG. 6, the upper chart illustrates the signal timing of the clock signal CLK inputted to the memory card 1, and the lower chart illustrates the signal timing of the data DAT output from the memory card 1.

In the MMC mode, as shown in FIG. 5, the data DAT is outputted at the fall edge of the clock signal CLK (the first data output timing).

Thus, in the frequency of the clock signal CLK in the MMC mode (about 20 MHz), even when the data DAT is outputted at the fall edge of the clock signal CLK, the data DAT output is in time by the next clock signal CLK.

On the other hand, when the mode is switched from the MMC mode into the HS-MMC mode, as shown in FIG. 6, although the data DAT is outputted at the fall edge of the clock signal CLK in the MMC mode, the mode is switched into the HS-MMC mode by the switch command 'CMD6', and thereby the frequency of the clock signal CLK is raised to about 52 MHz.

In this case, setting '1', for example, to the timing register 12 will switch the operation timing of the host interface 5 (FIG. 1) in the HS-MMC mode into the High Speed I/F Timing.

In the HS-MMC mode, the frequency of the clock signal CLK becomes heightened to about 52 MHz, and the data DAT is outputted at the rise edge of the clock signal CLK (the second data output timing). Thereby, the data DAT output can be made in time by the rise edge of the next clock signal CLK.

FIG. 7 illustrates one example of the timing edge switching circuit (data timing switching unit) 15 that switches the data output timings in the MMC mode and the HS-MMC mode, according to the parameter set to the timing register 12 (FIG. 4).

The timing edge switching circuit 15 is provided inside the host interface 5. The timing edge switching circuit 15 includes selectors 16, 17, latches 18, 19, and an inverter 20.

The control terminals of the selectors 16, 17 are connected each other to input the value set to the timing register 12. The selectors 16, 17 switch the destinations of outputs on the basis of the value inputted to the control terminals.

One input terminal of the selector (first selector) 16 and one input terminal of the latch (first latch) 18 are connected each other to input an output data enabling signal synchronized with the rise edge of the clock signal CLK. The output data enabling signal is outputted from the internal control logic 4, and it becomes the control signal for a tri-state buffer (output buffer) 8a to be described later.

And, one input terminal of the selector (second selector) 17 and one input terminal of the latch (second latch) 19 are connected respectively to input the output data DAT synchronized with the rise edge of the clock signal CLK, which is outputted from the internal control logic 4.

The clock terminals of the latches 18, 19 are connected respectively to input the signal in which the clock signal CLK is inverted by the inverter 20. The output terminal of the latch 18 is connected to the other input terminal of the selector 16, and the output terminal of the latch 19 is connected to the other input terminal of the selector 17.

The output terminal of the selector 16 is connected to the control terminal of the tri-state buffer 8a contained in the I/O buffer 8. The output terminal of the selector 17 is connected to the input terminal of the tri-state buffer 8a, and the output terminal of the tri-state buffer 8a is connected to the connector pin.

In the normal MMC mode, '0', for example, is set to the timing register 12, and the selectors 16, 17 are switched to each output the output data enabling signal and output data DAT that are outputted from the internal control logic 4 to the tri-state buffer 8a.

The tri-state buffer 8a outputs the output data DAT from the selector 17, when inputting the output data enabling signal outputted through the selector 16. Therefore, the data DAT is outputted to synchronize with the rise edge of the clock signal CLK.

When the mode is switched into the HS-MMC mode, '1' is set to the timing register 12. Then, the selectors 16, 17 are switched to each output the output data enabling signal and the output data DAT through the latches 18, 19 to the tri-state buffer 8a.

To the outputs of the latches 18, 19 are delivered the output data enabling signal (the first latch signal) to synchronize with the inverted signal of the clock signal CLK, and the data DAT (the second latch signal). Therefore, the tri-state buffer 8a outputs the data DAT to synchronize with the fall edge of the clock signal CLK.

FIG. 8 illustrates one example of the timing delay switching circuit (timing delay switching unit) 21 that switches the data output timings in the MMC mode and the HS-MMC mode by means of delay circuits, according to the value set to the timing register 12 (FIG. 4).

The timing delay switching circuit 21 is provided inside the host interface 5. The timing delay switching circuit 21 includes delay circuits 22 to 25, and selectors 26, 27.

The input terminals of the delay circuits 22 and 24 are connected respectively to input the output data enabling signal outputted from the internal control logic 4. The input terminals of the delay circuits 23 and 25 are connected respectively to input the data DAT outputted from the internal control logic 4.

The output terminal of the delay circuit (the first delay circuit) 22 is connected to one input terminal of the selector (the third selector) 26. The output terminal of the delay circuit (the third delay circuit) 24 is connected to the other input terminal of the selector (the third selector) 26.

The output terminal of the delay circuit (the second delay circuit) 23 is connected to one input terminal of the selector (the fourth selector) 27. The output terminal of the delay circuit (the fourth delay circuit) 25 is connected to the other input terminal of the selector (the fourth selector) 27.

The delay circuits 22 and 23 generate the delay time (the first delay time) of about 10 ns; and the delay circuits 24 and 25 generate the delay time (the first delay time) of about 3 ns.

The control terminals of the selectors 26, 27 are connected respectively to input the value set to the timing register 12. The selectors 26, 27 switch the destinations of outputs on the basis of the value inputted to the control terminals.

The output terminal of the selector 26 is connected to the control terminal of the tri-state buffer 8a contained in the I/O buffer 8. The output terminal of the selector 27 is connected to the input terminal of the tri-state buffer 8a.

In the normal MMC mode, '0', for example, is set to the timing register 12, and the selectors 26, 27 are switched to each output the output data enabling signal and output data DAT that are outputted from the delay circuits 22, 23 generating the longer delay time to the tri-state buffer 8a.

In the HS-MMC mode, '1' is set to the timing register 12. Then, the selectors 26, 27 are switched to output the output data enabling signal and the output data DAT that are outputted from the delay circuits 24, 25 generating the shorter delay time to the tri-state buffer 8a.

FIG. 9 illustrates the switching timing of the data output by the timing delay switching circuit 21.

In FIG. 9, the upper chart illustrates the signal timing of the clock signal CLK inputted to the memory card 1, and the lower chart illustrates the signal timing of the data DAT output from the memory card 1.

In the normal MMC mode, '0', for example, is set to the timing register 12, and the selectors 26, 27 select so that the output data enabling signal and the output data DAT are each outputted through the delay circuits 22, 23 to the tri-state buffer 8a.

In this case, the delay circuits 22 and 23 add the delay time of about 10 ns from the rise edge of the clock signal CLK to the output data enabling signal and the output data DAT, respectively, which are outputted to the tri-state buffer 8a.

In the HS-MMC mode, '1' is set to the timing register 12. Then, the selectors 26, 27 select on the basis of this value set to the timing register 12, so that the output data enabling signal and the output data DAT are each outputted through the delay circuits 24, 25 to the tri-state buffer 8a.

Thus, the delay circuits 24 and 25 add the delay time of about 3 ns from the rise edge of the clock signal CLK to the output data enabling signal and the output data DAT, respectively, which are outputted to the tri-state buffer 8a.

FIG. 10 is a timing chart, when the timing of the data DAT is switched by adjusting the rise time/fall time of the data DAT.

In FIG. 10, the upper chart illustrates the signal timing of the clock signal CLK inputted to the memory card 1, and the lower chart illustrates the signal timing of the data DAT output from the memory card 1.

As being shown in the drawing, the rise time/fall time of the data DAT is longer in the normal MMC mode; however, the rise time/fall time of the data DAT becomes shorter, as the mode is switched into the HS-MMC mode.

Thus, it is possible to adjust the output timing of the data DAT in the MMC mode and the HS-MMC mode, by adjusting the rise time/fall time of the data DAT.

FIG. 11 illustrates one example of the data output adjustment circuit (data output timing adjustment unit) 28 that adjusts the rise time/fall time of the data DAT shown in FIG. 10.

The data output adjustment circuit 28 includes an auxiliary buffer enable (auxiliary output buffer enable unit) 29 and an auxiliary buffer (auxiliary output buffer) 30. The data output adjustment circuit 28 is provided inside the I/O buffer 8 (FIG. 1).

The data output adjustment circuit 28 is connected to the tri-state buffer 8a, and the auxiliary buffer 30 is served as an auxiliary buffer for the tri-state buffer 8a.

One input terminal of the auxiliary buffer enable 29 is connected to input the output data enabling signal outputted from the internal control logic 4. The other input terminal of the auxiliary buffer enable 29 is connected to input the value set to the timing register 12.

The output terminal of the auxiliary buffer enable 29 is connected to the control terminal of the auxiliary buffer 30. The auxiliary buffer enable 29 is composed of, for example, logical product circuits and so forth.

The input terminals of the auxiliary buffer 30 and the tri-state buffer 8a are commonly connected; and, the output terminals of the auxiliary buffer 30 and the tri-state buffer 8a are commonly connected.

The input terminal of the tri-state buffer 8a is connected to input the data DAT outputted from the internal control logic 4, and the output terminal of the tri-state buffer 8a is connected to the connector pin.

In the normal MMC mode, since '0' is set to the timing register 12, the auxiliary buffer 30 is non-operational, and only the tri-state buffer 8a outputs the data DAT.

In the HS-MMC mode, since '1' is set to the timing register 12, the auxiliary buffer enable 29 outputs '1' to activate the auxiliary buffer 30.

Accordingly, both the tri-state buffer 8a and the auxiliary buffer 30 output the data DAT, which shortens the rise time/fall time of the data DAT.

FIG. 12 illustrates another example of the data output adjustment circuit (data output timing adjustment unit) 31 that adjusts the rise time/fall time of the data DAT shown in FIG. 10.

In this example, the output timing of the data DAT is switched not only by the operation timing (High Speed I/F Timing) in the host interface 5, but by combining the switching of the Power Class by the power consumption parameter register 13 (FIG. 4).

The data output adjustment circuit 31 is provided inside the I/O buffer 8 (FIG. 1), and is connected to the tri-state buffer 8a provided inside the I/O buffer 8.

The data output adjustment circuit 31 includes first through third buffer enable (auxiliary buffer enable units) 32 to 34, and first through third auxiliary buffers (auxiliary output buffers) 35 to 37.

The first through third buffer enable 32 to 34 are composed of, for example, three-input logical product circuits (AND) The three input terminals of the first through third buffer enable 32 to 34 are connected so as to input the output data enabling signal, the value set to the timing register 12, and the parameter set to the power consumption parameter register 13.

The input terminals of the first through third auxiliary buffers 35 to 37 are commonly connected to the input terminal of the tri-state buffer 8a. The input terminal of the tri-state buffer 8a is connected to input the data DAT outputted from the internal control logic 4. The control terminal of the tri-state buffer 8a is connected to input the output data enabling signal.

The output terminals of the first through third auxiliary buffers 35 to 37 are commonly connected to the output terminal of the tri-state buffer 8a. The connector pin is commonly connected to the output terminal of the tri-state buffer 8a.

And, the output terminals of the first through third buffer enable 32 to 34 are connected to the control terminals of the first through third auxiliary buffers 35 to 37 respectively.

In the normal MMC mode, since '0' is set to the timing register 12, the first through third auxiliary buffers 35 to 37 are non-operational, and only the tri-state buffer 8a outputs the data DAT.

In the HS-MMC mode, '1' is set to the timing register 12, and the Power Class is switched according the parameter set to the power consumption parameter register 13. Then, the first through third buffer enable 32 to 34 arbitrarily activate the first through third auxiliary buffers 35 to 37 according to the Power Class set to the power consumption parameter register 13.

For example, when the set Power Class is the maximum, the entire first through third auxiliary buffers 35 to 37 are driven to maximize the drive capability. And, when the set Power Class is the minimum, only the first auxiliary buffer 35 is driven on.

Thereby, the drive capability of the data DAT can be made variable according to the set Power Class.

In FIG. 11 and FIG. 12, the auxiliary buffer enable 29 and the first through third buffer enable 32 to 34 are provided inside the I/O buffer 8. However, these auxiliary buffer enable 29 and the first through third buffer enable 32 to 34 may be provided inside the host interface 5, in the same manner as the timing register 12 and the power consumption parameter register 13.

FIG. 13 illustrates an example for selecting the drive capability in the HS-MMC mode.

As shown in the drawing, when '1' is set to the timing register 12, now being in the HS-MMC mode, switching the Power Class will switch the drive capability of the buffers.

For example, in the Class1 where the power consumption is the minimum, only the first auxiliary buffer 35 is driven on. In the Class2 where the Power Class is next larger to the Class1, two buffers, the first and second auxiliary buffers 35 and 36, are driven on. In the Class3 where the power consumption is the maximum, the entire first through third auxiliary buffers 35 to 37 are driven on.

Further, the system clock frequency, the base of operation of the memory card 1, may be varied accompanied with the switching of the Power Class. FIG. 14 illustrates an example of modifying the system clock frequency by switching the Power Class set to the power consumption parameter register 13.

In the normal MMC mode, because the processing speed of the controller 3 maybe lower, the frequency of the system clock can be lowered to about 5 MHz to give priority to reduction of the power consumption.

In the HS-MMC mode, the frequency of the system clock is heightened as the power consumption is increased. When '1' is set to the power consumption parameter register 13 in this HS-MMC mode, the system clock of which frequency is about 6.6 MHz is supplied.

When '2' is set to the power consumption parameter register 13, the system clock whose frequency is about 10 MHz is supplied; when '3' is set to the power consumption parameter register 13, the power consumption of the memory card 1 is the maximum, and the system clock whose frequency is about 20 MHz is supplied.

FIG. 15 is a block diagram of the frequency selection circuit 38 that switches the system clock frequency of the memory card 1 accompanied with the switching of the Power Class shown in FIG. 14.

The frequency selection circuit 38 includes an oscillator (clock generator) 39, a ½ frequency divider 40, a ⅓ frequency divider 41, a ¼ frequency divider 42, and a selector (system clock selector) 43. The oscillator 39 generates the clock signal of a frequency being the base of the system clock.

The clock signal outputted from the oscillator 39 is inputted to the input terminals of the ½ frequency divider 40, ⅓ frequency divider 41, and ¼ frequency divider 42. The ½ frequency divider 40 divides the frequency of the clock signal (about 20 MHz) outputted from the oscillator 39 into ½ of the frequency, and generates the clock signal of about 10 MHz.

The ⅓ frequency divider 41 divides the frequency of the clock signal outputted from the oscillator 39 into ⅓ the frequency, and generates the clock signal of about 6.6 MHz. The ¼ frequency divider 42 divides the frequency of the clock signal outputted from the oscillator 39 into ¼ the frequency, and generates the clock signal of about 5 MHz.

The clock signal outputted from the oscillator 39 and each of the clock signals whose frequencies are divided by the ½ frequency divider 40, ⅓ frequency divider 41, and ¼ frequency divider 42 are inputted to the input terminal of the selector 43.

The control terminal of the selector 43 is connected to input the parameter set to the power consumption parameter register 13. The selector 43 selects one arbitrary clock signal among the four clock signals on the basis of the parameter, and supplies the selected one as the system clock to each of the internal circuits of the memory card 1.

Now in the memory card 1, the flash memories 2 may be used in the parallel operational states accompanied with the switching of the Power Class.

FIG. 16 is an explanatory chart showing the parallel operational number of the flash memories 2 corresponding to the parameters set to the power consumption parameter register 13. In the case of FIG. 16, the memory card 1 is assumed to contain four flash memories (non-volatile semiconductor memories) 2a to 2d.

As shown in FIG. 16, when the parameter set to the power consumption parameter register 13 is '0', the power consumption of the memory card 1 is the minimum, one of the flash memories 2*a* to 2*d* is arbitrarily selected and operated.

When the parameter set to the power consumption parameter register 13 is '1', arbitrarily two of the flash memories 2*a* to 2*d* are put into the parallel operation. When the parameter set to the power consumption parameter register 13 is '2', arbitrary three of the flash memories 2*a* to 2*d* are put into the parallel operation.

Further, when the parameter set to the power consumption parameter register 13 is '3', all the flash memories 2*a* to 2*d* are put into the parallel operation; and in this state, the power consumption of the memory card 1 is the maximum.

Thus, putting the flash memories 2*a* to 2*d* into the parallel operation with the switching of the Power Class makes it possible to enhance the processing speed of the data.

FIG. 17 is a timing chart of the memory card 1, when '0' is set to the power consumption parameter register 13. The write operation of the data DAT to the flash memories 2*a*, 2*b* will be explained hereunder.

FIG., 17 illustrates, from the top toward the bottom, the timings of the command CMD from the host, the processing of the controller 3, the parameter set to the power consumption parameter register 13, and the operational processing of the flash memories 2*a* to 2*d*.

First, the command CMD such as the write command and the like is inputted from the host, and then the write data DAT is inputted. The controller 3 outputs the write command to the flash memory 2*a*, and transfers the inputted data DAT to the flash memory 2*a*. Thereafter, the controller 3 waits for the flash memory 2*a* to complete the write operation.

The flash memory 2*a*, receiving the command from the controller 3, starts the write processing and writes the data DAT. When the write operation of the flash memory 2*a* is completed, the controller 3 outputs the command to the flash memory 2*b*, and transfers the inputted data DAT to the flash memory 2*b*.

Thereafter, the controller waits for the flash memory 2*a* to complete the write operation. The flash memory 2*b*, receiving the command from the controller 3, starts the write processing and writes the data DAT.

In this manner, the parallel operation is not executed in any of the flash memories 2*a* to 2*d*, when '0' is set to the power consumption parameter register 13.

FIG. 18 is a timing chart of the memory card 1, when '3' is set to the power consumption parameter register 13. The write operation of the data DAT to the flash memories 2*a* to 2*d* will be explained hereunder.

FIG. 18 illustrates, from the top toward the bottom, the timings of the command CMD from the host, the processing of the controller 3, the parameter set to the power consumption parameter register 13, and the operational processing of the flash memories 2*a* to 2*d*.

First, the command CMD such as the write command and the like is inputted from the host, and then the write data DAT is inputted. The controller 3 outputs the write command to the flash memory 2*a*, and transfers the inputted data DAT to the flash memory 2*a*.

In the same manner, the controller 3 sequentially transfers the write command and the data DAT to the flash memories 2*b* to 2*d*.

The flash memories 2*a* to 2*d* receive the command from the controller 3, sequentially start the write processing, and write the data DAT in parallel.

In this manner, when the parameter of the power consumption parameter register 13 is set to '3', and the power consumption of the memory card 1 becomes the maximum, all the flash memories 2*a* to 2*d* can be operated in parallel for the data write; therefore, the write speed can be enhanced to a great extent.

Now, as the high-speed data transfer becomes possible owing to the HS-MMC mode, the data transfer rate of the flash memories 2 will uniformly govern the transfer rate of the memory card 1.

To solve the above problem, FIG. 19 presents a circuit configuration of the card memory 1, in which the data transfer rate of the flash memories 2 is enhanced.

The memory card 1 includes the controller 3 and the flash memories 2, which is the same configuration as shown in FIG. 1, and newly includes a memory (volatile semiconductor memory) 44 served as the buffer for the controller 3.

The memory 44 is composed of a large-capacity volatile memory) such as SRAM (Static Random Access Memory) or SDRAM (Synchronous Dynamic Random Access Memory).

FIG. 20 illustrates various combinations of the parameters for selecting the memory 44.

For example, in the setting of the timing register 12 being '0' (MMC mode), and in the setting of the bus width being ×1, the memory 44 is non-activated even when any parameter of '0' to '3' is set to the power consumption parameter register 13.

In the setting of the timing register 12 being '0' (MMC mode), and in the setting of the bus width being ×4, the memory 44 is activated only when the parameter '3' is set to the power consumption parameter register 13.

Similarly, in the setting of the timing register 12 being '0' (MMC mode), and in the setting of the bus width being ×8, the memory 44 is activated when the parameter '2' or '3' is set to the power consumption parameter register 13.

Further, in the setting of the timing register 12 being '1' (HS-MMC mode), and in the setting of the bus width being ×1, the memory 44 is activated when the parameter '3' is set to the power consumption parameter register 13; and in the setting of the bus width being ×4, the memory 44 is activated when the parameter '2' or '3' is set to the power consumption parameter register 13.

In the setting of the timing register 12 being '1' (HS-MMC mode), and in the setting of the bus width being ×8, the memory 44 is activated when any one of the parameters '1' to '3' is set to the power consumption parameter register 13; and when the parameter '0' is set to the power consumption parameter register 13, the memory 44 is non-activated regardless of the bus width.

Thus, selecting the operation of the memory 44 by the various combinations of the parameters will make it possible to attain the optimum data transfer rate and enhance the data processing speed of the memory card 1.

FIG. 21 is a block diagram of the card memory 1 that supplies the operational voltage to the flash memories 2, according to the High Speed I/F Timing, Power Class, or the switching and combinations of these.

The memory card 1 includes the controller 3 and the flash memories 2, which is the same configuration as shown in FIG. 1, and newly includes a power supply circuit (power supply unit) 45 that supplies the operational supply voltage to the flash memories 2 under a given condition.

FIG. 22 is a block diagram of the power supply circuit 45.

The power supply circuit 45 includes a power supply selection control circuit 46, a booster 47, and a power supply selection circuit 48. The power supply selection control circuit 46 is provided, for example, inside the host interface 5, and outputs a booster activating signal to the booster 47 and the power supply selection circuit 48, on the basis of the values set to the timing register 12 and the power consumption parameter register 13.

The booster 47 generates a boosted supply voltage on the basis of the booster activating signal outputted from the power supply selection control circuit 46, by using a power supply voltage VDD supplied from the host. The power supply selection circuit 48 is connected to receive the power supply voltage VDD and the boosted supply voltage generated by the booster 47. When the booster activating signal from the power supply selection control circuit 46 is active, the power supply selection circuit 48 supplies the boosted supply voltage to the flash memories 2; and when the booster activating signal is inactive, the power supply selection circuit 48 supplies the power supply voltage VDD to the flash memories 2.

The power supply selection control circuit 46 makes the booster activating signal active, when '1' is set to the timing register 12 and the memory card 1 is in the HS-MMC mode, when the parameter equal to or larger than '1' is set to the power consumption parameter register 13, or when the memory card 1 is in the HS-MMC mode and the parameter equal to or larger than '1' is set to the power consumption parameter register 13.

On the basis of this booster activating signal, the booster 47 starts the operation, and the power supply selection circuit 48 selects the boosted supply voltage of about 3.3 V outputted from the booster 47 to supply to the flash memories 2.

Thereby, it is possible to operate the flash memories 2 with a high performance, and to enhance the data processing speed of the memory card 1.

Next, FIG. 23 illustrates a circuit configuration of the card memory 1 to enhance the performance thereof, by supplying the boosted supply voltage not only to the flash memories 2, but also to the controller 3, according to the High Speed I/F Timing, Power Class, or the switching and combinations of these.

The memory card 1 includes the controller 3 and the flash memories 2, which is the same configuration as shown in FIG. 1, and newly includes a power supply circuit (power supply unit) 49 that supplies the operational supply voltage to the flash memories 2 and the controller 3. This controller 3 is provided with a frequency selection circuit 50 to be described later.

FIG. 24 illustrates a circuit configuration including the power supply circuit 49 and the frequency selection circuit 50.

The power supply circuit 49 includes a power supply selection control circuit 51, a booster 52, and a power supply selection circuit 53. The frequency selection circuit 50 includes an oscillator 54, a frequency divider 55, and a selector 56.

The power supply selection control circuit 51 is provided, for example, inside the host interface 5, and outputs the booster activating signal to the booster 52, the power supply selection circuit 53, and the selector 56 on the basis of the values set to the timing register 12 and the power consumption parameter register 13.

The booster 52 generates the boosted supply voltage on the basis of the booster activating signal by using the power supply voltage VDD supplied from the host. The power supply selection circuit 53 is connected to receive the power supply voltage VDD and the boosted supply voltage generated by the booster 52.

When the booster activating signal from the power supply selection control circuit 51 is active, the power supply selection circuit 53 supplies the boosted supply voltage to the flash memories 2 and the controller 3. When the booster activating signal is inactive, the power supply selection circuit 53 supplies the power supply voltage VDD to the flash memories 2 and the controller 3.

The power supply selection control circuit 51 makes the booster activating signal active, when '1' is set to the timing register 12 and the memory card 1 is in the HS-MMC mode, when the parameter equal to or larger than '1' is set to the power consumption parameter register 13, or when the memory card 1 is in the HS-MMC mode and the parameter equal to or larger than '1' is set to the power consumption parameter register 13.

On the basis of this booster activating signal, the booster 52 starts the operation, and the power supply selection circuit 53 selects the boosted supply voltage outputted from the booster 52 to supply to the flash memories 2 and the controller 3.

In the frequency selection circuit 50, the oscillator 54 generates the clock signal of a frequency being the base of the system clock. The frequency divider 55 divides the frequency of the clock signal outputted from the oscillator 54.

The selector 56 inputs both the clock signal outputted from the oscillator 54 and the clock signal of which frequency is divided by the frequency divider 55. The selector 56 outputs one of the clock signal from the oscillator 54 and the clock signal from the frequency divider 55, on the basis of the booster activating signal from the power supply selection control circuit 51.

When the booster activating signal is inactive, the selector 56 supplies the controller 3 with the clock signal whose frequency is divided by the frequency divider 55, as the system clock. When the boosted voltage is supplied to the flash memories 2 and the controller 3 by the power supply circuit 49, the selector 56 supplies the controller 3 with the clock signal of a higher frequency that is outputted from the oscillator 54, as the system clock.

This power supply circuit 49 supplies not only the flash memories 2 but also the controller 3 with the boosted supply voltage as the operational supply voltage, whereby the microcomputer 7 of the controller 3 and so forth can be operated with a higher performance.

The power supply circuits 45, 49 in FIG. 21 and FIG. 23 may be contained inside the controller 3. Further, in FIG. 21 and FIG. 23, the boosted supply voltage is supplied to the flash memories 2. However, in the case the memory card incorporates an IC card, for example, the circuit may be configured to supply the IC card with the boosted supply voltage.

Thereby, this embodiment is able to provide the memory card 1 that can be used on the host conforming to the SD card, while achieving the conformity to both the standards of the MMC mode and HS-MMC mode.

Further, the embodiment is able to realize the memory card 1 with a high performance, while switching the power consumption and power supply voltage most suitably in response to the requirements of the host.

The invention being thus described in detail based on the embodiments, it should be well understood that the invention is not restricted to the above embodiments, and various modifications and changes are possible without a departure from the spirit and scope of the invention.

For example, the above embodiments describe the memory card conforming to both the operation modes of the MMC mode and the HS-MMC mode. However, when a high-speed operation mode is proposed as a new standard to the standard for the SD card, applying the technique described in the above embodiments to the SD card will make the SD card conform to the normal operation mode and the new high-speed operation mode.

The invention disclosed herein exhibits various effects, and the typical ones thereof are as follows.

(1) The invention achieves a memory card with a high compatibility that conforms to both the modes of the first operation mode and the second operation mode in the first operation standard, while securing the compatibility of the first operation standard and the second operation standard.

(2) The invention enhances the performance of a memory card, while switching the power consumption and power supply voltage most suitably in response to the requirements of the host.

What is claimed is:

1. A memory card conforming to a first operation standard, a second operation standard, and a third operation standard based on the first operation standard, comprising:
    a non-volatile semiconductor memory having a plurality of semiconductor memory cells, wherein each said memory cell is capable of storing information, and
    a controller that executes operation instructions to the non-volatile semiconductor memory based on received commands,
    wherein the controller controls a first data output timing that satisfies the first operation standard and the second operation standard, in a first operation mode, and controls a second data output timing that satisfies the third operation standard, in a second operation mode; and
    wherein the controller includes a data timing switching unit that outputs data at a falling edge of a clock signal in the first data output timing, and outputs data at a rising edge of a clock signal in the second data output timing;
    wherein the data timing switching unit includes:
        a timing register to which one of the first data output timing and the second data output timing is set,
        a first latch that latches an output data enable signal based on an inverted signal of the clock signal,
        a second latch that latches the data based on the inverted signal of the clock signal,
        a first selector that inputs the output data enable signal and a first latch signal outputted from the first latch, and selects and outputs one of the output data enable signal and the first latch signal based on a value set to the timing register, and
        a second selector that inputs the data and a second latch signal outputted from the second latch, and selects and outputs one of the data and the second latch signal based on the value set to the timing register, and
    wherein the data timing switching unit outputs:
        the output data enable signal and the data to an output buffer from the first selector and the second selector, respectively, when the first data output timing is set to the timing register, and
        the first latch signal and the second latch signal to the output buffer from the first selector and the second selector, respectively, when the second data output timing is set to the timing register,
    wherein the output buffer outputs the data based on the output data enable signal to output the data at the rising edge of the clock signal, and outputs the data based on the second latch signal in synchronization with the first latch signal to output the data at the falling edge of the clock signal.

2. The memory card according to claim 1, including a plurality of non-volatile semiconductor memories, wherein the controller controls a number of said non-volatile semiconductor memories in parallel operation, said number depending upon the power consumption parameter set to the power consumption parameter register.

3. A memory card conforming to a first operation standard, a second operation standard, and a third operation standard based on the first operation standard, comprising:
    a non-volatile semiconductor memory having a plurality of semiconductor memory cells, wherein each said memory cell is capable of storing information, and
    a controller that executes operation instructions to the non-volatile semiconductor memory based on received commands,
    wherein the controller controls a first data output timing that satisfies the first operation standard and the second operation standard, in a first operation mode, and controls a second data output timing that satisfies the third operation standard, in a second operation mode;
    wherein the controller includes a timing delay switching unit that outputs data at a first delay time at the first data output timing, and outputs data at a second delay time being shorter than the first delay time at the second data output timing;
    wherein the timing delay switching unit includes:
        a timing register to which one of the first data output timing and the second data output timing is set,
        a first delay circuit that delays an output data enable signal by the first delay time,
        a second delay circuit that delays the data by the first delay time,
        a third delay circuit that delays the output data enable signal by the second delay time,
        a fourth delay circuit that delays the data by the second delay time,
        a third selector that inputs output data enable signals outputted from the first and second delay circuits, and selects and outputs one of the two output data enable signals based on a value set to the timing register, and
        a fourth selector that inputs respective data pieces outputted from the first and second delay circuits, and selects and outputs one of the data pieces based on the value set to the timing register, and
    wherein the timing delay switching unit outputs:
        the output data enable signal delayed by the first delay circuit and the data delayed by the second delay circuit to an output buffer from the third selector and the fourth selector, respectively, when the first data output timing is set to the timing register, and
        the output data enable signal delayed by the first delay circuit and the data delayed by the fourth delay circuit to the output buffer from the third selector and the fourth selector, respectively, when the second data output timing is set to the timing register, and
        wherein the output buffer outputs the data based on the output data enable signal.

4. The memory card according to claim 3, including a plurality of non-volatile semiconductor memories, wherein the controller controls a number of said non-volatile semiconductor memories in parallel operation, said number depending upon the power consumption parameter set to the power consumption parameter register.

5. A memory card conforming to a first operation standard, a second operation standard, and a third operation standard based on the first operation standard, comprising:
- a non-volatile semiconductor memory having a plurality of semiconductor memory cells, wherein each said memory cell is capable of storing information; and
- a controller that executes operation instructions to the non-volatile semiconductor memory based on received commands;
- wherein the controller controls a first data output timing that satisfies the first operation standard and the second operation standard, in a first operation mode, and controls a second data output timing that satisfies the third operation standard, in a second operation mode;
- wherein the controller includes a data output time adjustment unit that adjusts a rise time/fall time of the data in the first data output timing, so that the rise time/fall time of the data is faster for the second data output timing than for the first data output timing; and
- wherein the data output time adjustment unit includes:
  - a timing register to which one of the first data output timing and the second data output timing is set,
  - an output buffer that outputs data based on an output data enable signal, when one of the first data output timing and the second data output timing is set to the timing register,
  - a plurality of auxiliary output buffers that output data based on the output data enable signal at the second data output timing, and
  - an auxiliary output buffer enable unit that outputs the output data enable signal to one of the auxiliary output buffers in correspondence with a power consumption parameter set to a power consumption parameter register, when the second data output timing is set to the timing register.

6. The memory card according to claim 5, including a plurality of non-volatile semiconductor memories, wherein the controller controls a number of said non-volatile semiconductor memories in parallel operation, said number depending upon the power consumption parameter set to the power consumption parameter register.

7. A memory card conforming to a first operation standard, a second operation standard, and a third operation standard based on the first operation standard, comprising:
- a non-volatile semiconductor memory having a plurality of semiconductor memory cells, wherein each said memory cell is capable of storing information, and
- a controller that executes operation instructions to the non-volatile semiconductor memory based on received commands,
- wherein the controller controls a first data output timing that satisfies the first operation standard and the second operation standard, in a first operation mode, and controls a second data output timing that satisfies the third operation standard, in a second operation mode;
- wherein the controller includes a timing delay switching unit that outputs data at a first delay time at the first data output timing, and outputs data at a second delay time being shorter than the first delay time at the second data output timing;
- wherein the controller includes:
  - the power consumption parameter register to which are set power consumption parameters that specify respective power consumptions,
  - a clock generator that generates a clock signal,
  - a plurality of frequency dividers that output to divide a frequency of the clock signal generated by the clock generator into different frequencies, and
  - a system clock selector that selects one of a plurality of clock signals outputted from the plurality of frequency dividers based on a power consumption parameter set to the power consumption parameter register, and that supplies the selected clock signal as a system clock, and
- wherein the system clock selector selects the system clock of a higher frequency, as the power consumption parameter becomes a value larger than a default value corresponding to a minimum power consumption.

8. The memory card according to claim 7, including a plurality of non-volatile semiconductor memories, wherein the controller controls a number of said non-volatile semiconductor memories in parallel operation, said number depending upon the power consumption parameter set to the power consumption parameter register.

* * * * *